United States Patent [19]
Ohtani et al.

[11] Patent Number: 6,140,166
[45] Date of Patent: Oct. 31, 2000

[54] METHOD FOR MANUFACTURING SEMICONDUCTOR AND METHOD FOR MANUFACTURING SEMICONDUCTOR DEVICE

[75] Inventors: Hisashi Ohtani; Tamae Takano; Taketomi Asami; Etsuko Fujimoto, all of Kanagawa, Japan

[73] Assignee: Semicondutor Energy Laboratory Co., Ltd., Kanagawa-ken, Japan

[21] Appl. No.: 08/997,910

[22] Filed: Dec. 24, 1997

[30] Foreign Application Priority Data

Dec. 27, 1996 [JP] Japan ................................ 8-358972
Mar. 13, 1997 [JP] Japan ................................ 9-078979

[51] Int. Cl.⁷ ............................. H01L 21/00; H01L 21/20
[52] U.S. Cl. ......................................... 438/166; 438/486
[58] Field of Search ................................ 438/486, 166

[56] References Cited

U.S. PATENT DOCUMENTS

| | | |
|---|---|---|
| 5,403,772 | 4/1995 | Zhang et al. . |
| 5,534,716 | 7/1996 | Takemura . |
| 5,563,426 | 10/1996 | Zhang et al. . |
| 5,605,846 | 2/1997 | Ohtani et al. ................... 437/174 |
| 5,643,826 | 7/1997 | Ohtani et al. . |
| 5,879,977 | 3/1999 | Zhang et al. ................... 438/166 |
| 5,888,857 | 3/1999 | Zhang et al. . |
| 5,922,125 | 7/1999 | Zhang .............................. 117/9 |
| 5,923,962 | 7/1999 | Ohtani et al. . |
| 5,942,768 | 8/1999 | Zhang . |

FOREIGN PATENT DOCUMENTS

| | | |
|---|---|---|
| 7-045519 | 2/1995 | Japan . |
| 7-066425 | 3/1995 | Japan . |
| 7-130652 | 5/1995 | Japan . |
| 7-335548 | 12/1995 | Japan . |
| 8-213634 | 8/1996 | Japan . |
| 9-312260 | 12/1997 | Japan . |

*Primary Examiner*—Brian Dutton
*Attorney, Agent, or Firm*—Fish & Richardson P.C.

[57] ABSTRACT

A method for manufacturing a semiconductor, comprising crystallizing an amorphous silicon film formed on a substrate by employing lateral growth method using a catalyst element which accelerates the crystallization, wherein the duration of annealing accounts for 90% or more but less than 100% of the time for crystallization of the amorphous silicon film under the condition that no catalyst element is used. Also provided is a method for manufacturing a semiconductor, comprising: obtaining the equation which relates the annealing temperature to the duration of annealing in case crystallization of the amorphous silicon film initiates spontaneously; obtaining the equation which relates the annealing temperature to the laterally grown distance in case lateral growth method using a catalyst element for accelerating crystallization is applied to the amorphous silicon film formed on the substrate above; specifying the annealing duration and the annealing temperature which satisfy the relationship above for a desired growth distance; and performing annealing at a temperature not higher than said annealing temperature, and thereby laterally growing the amorphous silicon film by using a catalyst element. Further, semiconductor devices are provided using the semiconductor manufactured by the methods described above.

21 Claims, 12 Drawing Sheets

METHOD FOR MANUFACTURING SEMICONDUCTOR AND METHOD FOR MANUFACTURING SEMICONDUCTOR DEVICE

BACKGROUND OF THE INVENTION

1. Field of the Invention

The present invention relates to a method for producing a crystalline silicon film that is formed on an insulating substrate such as a glass substrate, or a semiconductor substrate such as a single crystal silicon substrate, on which an insulating film is formed. In particular, the present invention relates to a method for obtaining a crystalline silicon film having a favorable crystalline state, comprising crystallizing an amorphous silicon film by means of annealing, in which lateral growth is allowed to occur on the amorphous silicon film by using a catalyst element (e.g., nickel) which accelerates the crystallization. Also, the invention relates to a method for manufacturing a semiconductor using such a crystalline silicon film.

2. Description of the Related Art

A crystalline silicon film that is formed on an insulating surface is indispensable for a semiconductor device such as a thin film transistor.

In general, a crystalline silicon film is obtained by crystallizing an amorphous silicon film by means of heating the amorphous silicon film or by irradiating laser light.

However, considering the electric properties, the crystalline silicon film obtained by heating or by irradiating a laser light is far inferior to a single crystal silicon wafer. Moreover, at present, a thin film transistor (referred to as a "TFT") implemented by using such crystalline silicon films is also far inferior to a MOS-type transistor using a single crystal silicon wafer.

This is ascribed to the fact that the crystalline silicon film thus obtained contains defects at high density.

At present, the operation speed of a TFT consisting of a crystalline silicon film using an amorphous silicon film as the starting film is about several MHz or lower at best.

In contrast to above, an integrated circuit using a single crystal wafer having an operation speed of about 200 MHz is already put into practical use.

In case a technology generally known as SOI technology is employed, a MOS-type transistor having an operation speed exceeding the case of using a single crystal wafer is obtained because the capacitance is effectively reduced.

This technology comprises forming a single crystal layer on the silicon oxide layer by utilizing a single crystal silicon wafer. However, this technology is not practically feasible because of its disadvantages such that the size of the single crystal wafer is limited, and that it requires a complicated and costly manufacturing process.

According to the study of the present inventors, it is known that, by using particular kinds of metal elements which accelerate the crystallization of silicon, an amorphous silicon film can be modified into a high quality crystalline silicon film at a lower temperature and in a shorter duration of time.

The metal elements which accelerate the crystallization of silicon include nickel (Ni), platinum (Pt), palladium (Pd), copper (Cu), silver (Ag), and iron (Fe).

In particular, the direction of crystal growth can be controlled by non-selectively introducing such metal elements, and thus, silicon films having the preferred crystal structure suitable for devices can be obtained.

By employing such a technology, a TFT having characteristics well comparable to those of a MOS-type transistor using a single crystal silicon wafer can be realized (see Japanese Patent Application No.8-335152 filed by the present inventors on Nov. 29, 1996).

This technology is denoted as "lateral growth method". In a silicon film obtained by the lateral growth method, crystal grain boundaries are formed in parallel with the direction of growth; hence, by controlling the direction of electric current to be in parallel with the direction of crystal growth, the effect of the crystal grain boundaries can be reduced extremely. As a result, a polycrystalline material having characteristics well equivalent to those of a single crystal material can be realized.

The lateral growth method is described briefly below. The method comprises forming a mask film made of silicon oxide and the like on an amorphous silicon film, and forming selectively a window therein. A metal element, representatively nickel, which accelerates the crystallization of silicon, is introduced into the amorphous silicon film through this window. In FIG. 1A, a window is denoted by reference numeral 11.

As a method for introducing the metal element, there can be mentioned a method comprising depositing on a predetermined region of the amorphous silicon film, a film of a compound containing the metal element by means of sputtering (see Japanese Unexamined Patent Publication No.7-45519 or 7-66425), a vapor growth method (Japanese Unexamined Patent Publication No. 7-335548), or a coating method (Japanese Unexamined Patent Publication No.7-130652).

Then, by performing annealing for crystallization, the region of crystalline silicon (lateral growth region) 13 is expanded around the window. Such a region can be obtained because the catalyst element crystallizes the amorphous silicon film while it diffuses inside the silicon film. In general, crystallization proceeds farther for higher temperature and longer duration (see FIG. 1A; details are described in the unexamined patent publications mentioned above). This crystal growth is called lateral growth because it proceeds in the direction parallel with the film plane.

The properties of the semiconductor device can be improved by arranging the direction of lateral growth to match with the direction of current flow in semiconductor devices such as a thin film transistor (TFT). Specifically, TFTs can be arranged in a variety of ways. An example of such ways is shown in FIG. 3. Referring to FIG. 3, there is shown a crystallized region 302 obtained by lateral growth around a window portion 301 into which the catalyst element is added.

In such a case, an oval laterally grown region as shown in FIG. 3 can be obtained if a rectangular window 301 is provided. In this case, the gate electrode 304 is arranged approximately in parallel with the region 301 as is shown by TFT1, so that crystal growth may occur in a direction from drain 305 to source 303, or in the reversed direction.

Furthermore, as is shown in TFT2 of FIG. 3, there are cases in which the region 301 is arranged approximately vertical to the gate electrode 307, so that the crystal growth may occur approximately simultaneously with source 306 and drain 308. Thus, concerning the characteristics of the resulting TFT, high ON current is obtained when the former method is adopted because the crystal grain boundaries are arranged in a direction parallel to the direction of current flow. In contrast to this, a TFT with high OFF current results when the latter method is adopted, because the crystal grain boundaries are arranged in a direction vertical to the direction of current flow.

Otherwise, the window may be narrowed into a line so that the catalyst element is added linearly. FIGS. 4A and 4B show a case of a circuit provided with a plurality of TFTs, in which the regions 401 and 406 of catalyst element addition are formed in parallel with the gate lines 402 and 407. FIG. 4A corresponds to TFT2 shown in FIG. 3, which is the case of adding catalyst elements approximately vertical to the gate electrodes of the TFTs 403 to 405. FIG. 4B corresponds to TFT1 shown in FIG. 3, which is the case of adding catalyst elements approximately vertical to the gate electrodes of the TFTs 408 to 410.

Controlling the direction of crystal growth by using the lateral growth process is effective in sophisticated semiconductor integrated circuits in which devices having functions conflicting to each other are formed on a single substrate. FIG. 5 shows a block diagram of a monolithic active matrix circuit for use in liquid crystal displays. Referring to FIG. 5, a source driver (column driver) 501 and gate driver (row driver) 502 are provided as peripheral driver circuits. In the figure are also shown a video signal 503, a latch pulse 504, a shift register X 505, an analog memory 506, an analog switch 507, an analog buffer 508, and a shift register Y 509.

A large number of pixel circuits comprising transistors 511 and capacitors 512 for switching are formed in the active matrix circuit (pixel) region 510; the pixel transistors 511 of the active matrix circuit are connected with the peripheral driver circuit by the source lines and the gate lines corresponding to the number of rows and columns, respectively. In FIG. 5, a liquid crystal portion 513 is also shown. High speed operation is required for the TFTs that are used in the peripheral circuit, and particularly, for the peripheral logic circuits such as a shift register. To fulfill this requirement, it is required that the current when selected (ON current) is high, and that the scattering is small.

In contrast to above, TFTs for use in pixel circuits are required in which the charge accumulated in the capacitor can be retained for a longer duration of time. Accordingly, they should have a sufficiently low leak current (i.e., OFF current) when it is not selected, that is, the leak current is sufficiently low when reversed bias voltage is applied to the gate electrode, and in which the fluctuation thereof is small. More specifically, an OFF current of 1 pA or lower with a fluctuation within one digit is required. To the contrary, the ON current need not be so high.

As described above, TFTs having physical properties thus conflicting with each other, i.e., a high ON current and low leak current, yet, with small fluctuation in the value, are required to be formed on a single substrate. However, it can be readily understood that it is extremely difficult to technologically fulfill these requirements by an ordinary method of crystallization.

The problems above can be solved by controlling the direction of crystallization by employing lateral growth method (see Japanese Unexamined Patent Publication No.8-213634). It is well known that lateral growth method using catalyst elements is effective.

Furthermore, the fluctuation in characteristics of devices can be minimized.

Moreover, TFTs manufactured by using the thus laterally grown region can be operated at a speed as high as several hundreds of megahertz (MHz) (see Japanese patent application No. 8-335152 filed by the present inventors on Nov. 29, 1996).

Still, problems were found on the control in distance of lateral growth and on the reliability of the resulting device characteristics.

To solve the problems above, intensive study has been carried out, and the following points have been found.

(1) It is sometimes found to generate a region comprising concentrated defects on the way of lateral growth, or a region in which lateral growth is apparently impaired.

(2) The TFTs manufactured by using the portions of such a state exhibit inferior device characteristics and low reliability.

Ideally, an infinitely large laterally growth can be obtained by performing annealing at a higher temperature and for a longer duration of time. In fact, however, although the laterally grown region expands, a plurality of portions of catalyst element precipitation are formed inside the expanded region. The catalyst elements are electrically conductive, and when they are etched, vacancies remain on the silicon film to cause defective circuits.

Thus, when an attempt is made to obtain a large laterally grown region, the quality of the crystal as a whole decreases due to the precipitation of the catalyst element. This is illustrated in FIG. 1B. FIG. 1B shows the state in which lateral growth continues from the state shown in FIG. 1A, and the region 13 of lateral growth expands to the portion shown by the oval 14 drawn by a solid line (In FIG. 1A, the portion is shown by an oval 12 drawn by broken lines).

However, particularly in the portion far from the window, a region in which catalyst element is precipitated (indicated by black dots 15 in FIG. 1B) appears.

In general, the window 11 and the region in vicinity thereof are high in catalyst element concentration, and are therefore preferred that the main portion of the device is manufactured without using these regions. Under the present technology level, in a lateral growth method using nickel as a catalyst element, the width of the lateral growth free from precipitation of nickel is from 50 to 60 $\mu$m at maximum, but it is necessary to increase the lateral growth region in larger devices.

As a result of intensive study on this point, the precipitation of catalyst element has been found to occur due to the discontinuation of lateral growth attributed to spontaneous crystallization (generation of crystal nuclei and crystal growth which occurs without the function of catalyst element). In other words, it has been found that it occurred influenced by the spontaneous crystallization other than the crystallization using the function of the additional metal element.

In further detail, lateral growth using the function of a metal element was found to be greatly obstructed or halted when it reached the crystal growth region which proceeds spontaneously.

This has been found to be the cause of concentrating defects to a part of the lateral growth region or of realizing a state in which the lateral growth is obstructed, and also, a cause of fluctuation in the characteristics or instability in a TFT obtained.

SUMMARY OF THE INVENTION

An object of the present invention is to solve the aforementioned problems. More specifically, an object of the present invention is to provide annealing conditions which realizes a larger lateral growth region while reducing the precipitation of catalyst element.

According to an aspect of the present invention, it is characterized by crystallizing an amorphous silicon film by employing lateral growth method to perform annealing at temperature $T_0$ using a catalyst element which accelerates the crystallization, provided that, the duration of annealing accounts for 90% or more but less than 100% of the time duration to necessary to crystalize at temperature $T_0$ under the conditions of using no catalyst elements.

According to the present inventors' observation, it has been found that the precipitation of catalyst elements occurs due to the discontinuation of lateral growth attributed to spontaneous crystallization of the amorphous silicon film. Hence, the precipitation of catalyst element can be suppressed by performing lateral growth under the conditions where no spontaneous crystallization occurs.

Given with the annealing temperature, the time at which spontaneous crystallization initiates can be specified. If annealing is carried out for a duration of time exceeding the specified range, catalyst elements precipitates by spontaneous crystallization. If the duration of annealing is too short, it results in an insufficient lateral growth. It is therefore preferred that the duration of time is limited to 90% or more but less than 100% of the time $t_0$ when spontaneous crystallization initiates. However, there remains the possibility that a lateral growth region having a desired area cannot be obtained.

To overcome this problem, the annealing temperature and the duration of annealing are determined from the required width of lateral growth by setting the annealing temperature as a variable. More specifically, first, the relational expression between the annealing temperature and the duration of annealing at the critical conditions in spontaneous crystallization as follows is obtained:

$$t=f(T)$$

where, T represents the annealing temperature and t represents the duration of annealing.

For example, in case an amorphous silicon film formed by plasma CVD is annealed at 600° C., spontaneous crystallization occurs in 4 hours. Similar data is obtained for other temperatures and the results are shown, for instance, in a graph of FIG. 1C. In FIG. 1C, the abscissa shows the temperature, and the ordinate represents the time duration.

In general, different curves are obtained depending on the manufacturing process of an amorphous silicon film. For instance, an amorphous silicon film obtained by plasma CVD (solid lines in FIG. 1C, indicated by Si-film b) can be crystallized more easily than one obtained by low pressure CVD (dotted lines in FIG. 1C, indicated by Si-film a); thus, the curve for the former is located at lower left of the curve for the latter.

Then, the relational expression between the annealing temperature and the growth distance as follows is obtained for lateral growth:

$$x=g(T, t)$$

where, x represents the growth distance. This can be seen, for example, in FIG. 1D. In the graph of FIG. 1D, the growth rate expressed in the ordinate is shown by logarithmic scale, whereas the abscissa represents the reciprocal of the temperature (1/(temperature)).

Thus, for a given desired growth distance $x_0$, critical time duration of annealing to and critical annealing temperature $T_0$ can be obtained as values satisfying the relation above.

In fact, a crystalline silicon film almost free of any precipitates of catalyst element can be obtained for a desired lateral growth distance by performing annealing at any temperature not higher than the critical annealing temperature $T_0$ described above. By further continuing the annealing, precipitation of catalyst element occurs with the occurrence of spontaneous crystallization on the outside of the laterally grown region. However, there is no problem if the portion at which spontaneous crystallization has occurred is not important for the desired circuit. Thus, this method allows lateral crystallization to occur to a desired distance with few precipitation of catalyst metal. More preferably, the duration of annealing and the annealing temperature fall in a range of 90% or more and less than 100% of the critical time duration of annealing and critical annealing temperature.

In the present invention, the critical conditions of spontaneous crystallization can be measured (or determined) effectively by observation using optical microscope or electron microscope, or by a spectroscopic means (such as Raman spectroscopy). However, it should be noted that the relational expression obtained is not universal; that is, the relation differs depending on the determination methods. Thus, the critical annealing duration and the critical annealing temperature differs depending on the method of determining spontaneous crystallization.

Furthermore, the relation between the temperature and the duration of time changes with changing conditions in spontaneous crystallization as well as in lateral growth. The conditions include the substrate and base film, the thickness of the amorphous silicon film and the method of forming the film, cap film (mask film), etc. Thus, in case of determining the relation function g, the same conditions used in forming the amorphous silicon film must be employed. In case of determining the relation function f, it is effective to cover the amorphous silicon film with a mask film that is used in lateral growth of the amorphous silicon film.

It is also known that the temperature at which the crystallization proceeds in case the metal element is used to accelerate the crystallization of silicon differs from the temperature at which crystallization occurs spontaneously. More specifically, the temperature $T_2$ of spontaneous crystallization is higher than the temperature $T_1$ of the crystallization accelerated by the use of a metal element.

Thus, by allowing the lateral growth to occur under properly set conditions at which spontaneous crystallization does not proceed, lateral growth can be proceeded smoothly. More specifically, the negative influence of spontaneous crystallization on lateral growth can be suppressed by allowing lateral growth to occur at a temperature at which spontaneous crystallization does not proceed (i.e., the temperature at which spontaneous nucleation does not take place or can be neglected).

FIG. 8 shows a graph obtained by plotting the nucleation ratio (ordinate) for each of the heat treatment temperatures (abscissa) in case of crystallizing an amorphous silicon film obtained by low pressure thermal CVD (LPCVD), in which nickel is used as the catalyst element. The sample was prepared in accordance with the process described hereinafter in Example 2. The term "nuclei" used in "nucleation ratio" herein signifies the "nuclei obtained in spontaneous crystallization", and it refers to the initial stage of spontaneous crystallization.

The nucleation ratio shown in FIG. 8 is obtained by selecting a region free from the influence of nickel, and observing it using an optical micrograph.

According to the knowledge of the present inventors, lateral growth is evaluated free from the influence of spontaneous crystallization if the generation ratio of spontaneously generated nuclei in an area of 1 $\mu m^2$ is $10^{-2}$ nuclei or less per 1 hour.

In case the starting film is formed by low pressure thermal CVD (LPCVD), referring to FIG. 8, a heat treatment temperature at which the spontaneous nucleation ratio in an area of 1 $\mu m^2$ is not higher than $10^{-2}$ nuclei per hour.

Referring to FIG. 8, the value of the abscissa for a spontaneous nucleation ratio of $10^{-2}$ can be read as 1.166. Thus, by calculating $1000/(t+273)=1.166$, $t=585°$ C. can be obtained. That is, in case the starting film is formed by low pressure thermal CVD (LPCVD), the spontaneous nucleation ratio in an area of 1 $\mu m^2$ can be suppressed to $10^{-2}$ nuclei or less per hour by setting the heating temperature to 585° C. or lower during crystallization.

The heat treatment temperature for a spontaneous nucleation ratio of $10^{-2}$ in case the starting film is formed by PCVD can be obtained by calculating similarly as above. Thus, by calculating $1000/(t+273)=1.2025$, $t=559°$ C. can be obtained. That is, in case the starting film is formed by plasma CVD (PCVD), the spontaneous nucleation ratio in an area of 1 $\mu m^2$ can be suppressed to $10^{-2}$ nuclei or less per 1 hour by setting the heating temperature to 559° C. or lower during crystallization.

In contrast to above, the rate of lateral growth (growth distance per unit of time) can be lowered by decreasing the heating temperature while performing crystallization.

When manufacturing an integrated circuit, it is desired to obtain a lateral growth distance of about 100 $\mu$m. The duration of heat treatment is preferably 50 hours or less (as a matter of course, the shorter time duration is preferable from the viewpoint of operation efficiency).

To satisfy the conditions above, it is required to complete the heat treatment of a crystal growth distance of 100 $\mu$m within 50 hours. Thus, a speed of lateral growth of 2 $\mu$m or higher is required.

FIG. 9 shows the relation between the rate of lateral growth (ordinate) and the heat treatment temperature (abscissa). The sample can be manufactured in accordance with the process described in Example 2.

Referring to FIG. 9, the rate of lateral growth is clearly dependent on the heating temperature. That is, the rate of lateral growth is higher for a higher heating temperature, and the lateral growth is more sluggish for a lower heating temperature. Furthermore, it can be read that the temperature dependence of growth rate differs depending on which film to be used as the starting material; i.e., whether a LPCVD film or a PCVD film is selected.

However, in fact, it is believed that the temperature dependence of the lateral growth rate is attributed to the quantity of nickel introduced for the crystallization, and not to the film quality (the difference in the method of forming the film). The reason is that the difference in plotted points shown in FIG. 9 reflects the difference in concentration of nickel (i.e., nickel concentration in nickel acetate) introduced into the film.

Furthermore, from experimental results, it is known that there is almost no difference in growth rate depending on film quality (the difference in the method of forming the film) when the nickel concentration of nickel acetate is not changed.

Accordingly, it can be concluded that the difference in growth rate is attributed to the difference in the quantity of nickel introduced into the film. Accordingly, FIG. 9 shows the temperature dependence of lateral growth rate reflecting the difference in the quantity of nickel introduced into the film.

The heat treatment temperature in the case where lateral growth rate is 2 $\mu$m/hr can be obtained from FIG. 9. The plots obtained for a sample crystallized by using a nickel acetate solution containing 100 ppm nickel is used in this case.

First, the straight line (solid line shown in FIG. 9) obtained by connecting the plots is extrapolated until it crosses a straight line which passes a point of 2 $\mu$m/hr in the ordinate with gradient of 0 (i.e., a straight line in parallel with the abscissa), and the coordinates for the crossing point are obtained. Thus, the value for T is obtained from the coordinates to result in an equation of $(1000/T)=1.248$. Because $T=273+t$, t can be calculated as 528° C.

That is, to maintain a growth rate of 2 $\mu$m/hr or higher, it is concluded that a heating temperature of 528° C. or higher should be fulfilled during crystallization. This temperature is independent to the film forming process.

Furthermore, when the concentration of nickel to be introduced is reduced to $\frac{1}{10}$, a temperature of 536° C. is obtained by using the straight line connecting the plots for 10 ppm in FIG. 9. That is, the straight line (dotted lines shown in FIG. 3) obtained by connecting the plots is extrapolated until it crosses a straight line which passes a point of 2 $\mu$m/hr in the ordinate with gradient of 0 (i.e., a straight line in parallel with the abscissa), and the coordinates for the crossing point are obtained. Thus, the value for T is obtained from the coordinates to result in an equation of $(1000/T)=1.236$. Because $T=273+t$, t can be calculated as 536° C.

To conduct a practical lateral growth, the concentration of nickel in nickel acetate solution should be 10 ppm or higher. Conclusively, to obtain a growth rate of 2 $\mu$m/hr or higher, a heating temperature at crystallization of 536° C. or higher is required.

The same holds true in the case where other means are used to introduce nickel into the film. Furthermore, as a matter of course, the heat treatment temperature can be elevated in the case where the quantity of nickel introduced into the film is increased.

From the discussion above, it can be concluded as follows in case low pressure thermal CVD (LPCVD) is employed for the formation of the starting film. The heat treatment temperature should be selected from a range of from 536 to 585° C. to satisfy the conditions of:

(1) Suppressing spontaneous nucleation, and.

(2) Maintaining the lateral growth rate of 2 $\mu$m/hr or higher.

Then, in case plasma CVD (PCVD) is used for the formation of the starting film, it is concluded that the heat treatment temperature should be selected from a range of from 536 to 559° C. to satisfy the conditions of:

(1) Suppressing spontaneous nucleation, and.

(2) Maintaining the lateral growth rate of 2 $\mu$m/hr or higher.

The maximum growth rate obtained under a state of suppressing spontaneous nucleation is calculated from FIG. 3. When LPCVD film is used for the starting film, the rate is less than 20 $\mu$m/hr, and for PCVD film, it is higher than 7 $\mu$m/hr.

That is, in case of a LPCVD film, T=858 K is obtained for t=585° C. from T=(t+273), and the coordinate corresponding to the abscissa in FIG. 9 is 1.166, from which rate is read as less than 20 $\mu$m/hr from FIG. 9.

On the other hand, in case of a PCVD film, T=832 K is obtained for t=559° C. from T=(t +273), and the coordinate corresponding to the abscissa in FIG. 9 is 1.202, from which rate is read as higher than 7 $\mu$m/hr from FIG. 9.

In the calculation above, the maximum growth rate is to be obtained. Accordingly, plots (solid line) for a nickel concentration of 100 ppm must be used.

When higher productivity is required, preferably, a lateral growth distance of 100 $\mu$m should be achieved in about 25 hours. In such a case, the growth distance of about 4 µm/hr is required. The lower limit of the heat treatment temperature under such a condition is 545° C.

That is, by taking the solid line (for a case the quantity of nickel introduced is high) in FIG. 9 into consideration, the value corresponding in the abscissa corresponding to 4 µm/hr is 1.223. Thus, the corresponding temperature is 545° C. That is, to achieve a growth rate of 4 µm/hr or higher, the heating temperature should be 545° C. or higher.

In case the quantity of nickel introduced into the film is lowered, the lower limit of the heating temperature becomes more higher. For instance, referring to the dotted lines (for a case the quantity of nickel introduced is low) in FIG. 9, the value corresponding in the abscissa corresponding to 4 µm/hr is 1.212. Thus, the corresponding temperature is 552° C. That is, to achieve a lateral growth rate of 4 µm/hr or higher, the heating temperature should be 552° C. or higher in a minimum quantity of nickel introduced.

Thus, from the discussion above, according to an aspect of the present invention, there is provided a method for manufacturing a semiconductor comprising the steps of:

forming an amorphous silicon film on an insulating surface by means of low pressure thermal CVD process;

selectively introducing nickel element into a partial area of the amorphous silicon film; and applying heat treatment and thereby allowing crystal growth to occur in a direction parallel to a film plane from the area into which the nickel element is selectively introduced;

wherein the heat treatment is performed in a temperature range of from 536 to 585° C., and the crystal growth is performed in a rate of from 2 µm/hr to 20 µm/hr.

Further according to another aspect of the present invention, there is provided a method for manufacturing a semiconductor comprising the steps of:

forming an amorphous silicon film on an insulating surface by means of plasma CVD process;

selectively introducing nickel element into a partial area of the amorphous silicon film; and applying heat treatment and thereby allowing crystal growth to occur in a direction parallel to the film plane from the area into which the nickel element is selectively introduced, wherein the heat treatment is performed in a temperature range of from 536 to 559° C., and the crystal growth is performed in a rate of from 2 µm/hr to 7 µm/hr.

By adopting the constitution above, the spontaneous nucleation during heat treatment can be suppressed to $10^{-2}$ nuclei/hr or less for an area of 1 $\mu m^2$.

The present invention can be applied to manufacturing of a semiconductor itself, or to manufacturing of TFTs and thin film integrated circuits, or to devices using the same, such as personal handyphone systems and computers.

As substrates having insulating surfaces, included are glass substrates, quartz substrates, semiconductor substrates on which insulating films are formed, alumina/glass substrates, etc.

The most simple method for selectively introducing nickel element into the film is the one using a solution as is described hereinafter. However, nickel element may be introduced selectively into a part of the amorphous silicon film by using methods such as ion implantation, plasma treatment (discharge treatment using an electrode containing nickel), sputtering, CVD process, gas adsorption method, etc.

To allow crystal growth to proceed in a direction in parallel with the film plane from the region into which nickel is introduced selectively signifies to allow crystal growth to proceed in a direction in parallel with the substrate (denoted as "lateral growth") as is shown by numeral 10 in FIG. 7B.

The term a "spontaneous nucleus" signifies a crystal nucleus that is formed in the initial stage of nucleation which proceeds spontaneously by heat treatment without using any nickel. This can be observed by using an optical microscope.

The constitution of the invention is based on experimental data. Accordingly, in practical use, an allowance of (±5° C. is preferably included in the limits of temperature range.

Thus, in case an amorphous silicon film formed by low pressure thermal CVD (LPCVD) is used as the starting film, the requirements such as achieving lateral growth free from influence of crystal growth attributed to spontaneous nucleation and a practically feasible growth rate from the view point of a manufacturing process can be fulfilled by:

controlling the temperature of the heat treatment to fall in a range of form 536 to 585° C.; and controlling the crystal growth rate to a range of from 2 to 20 µm/hr;

thereby suppressing spontaneous nucleation rate to $10^{-2}$ nuclei/hr or less for an area of 1 $\mu m^2$.

Furthermore, in case an amorphous silicon film formed by plasma CVD (PCVD) is used as the starting film, the requirements such as achieving lateral growth free from influence of crystal growth attributed to spontaneous nucleation and a practically feasible growth rate from the view point of a manufacturing process can be fulfilled by:

controlling the temperature of the heat treatment to fall in a range of form 536 to 559° C.; and controlling the crystal growth rate to a range of from 2 to 7 µm/hr;

thereby suppressing spontaneous nucleation rate to $10^{-2}$ nuclei/hr for an area of 1 $\mu m^2$.

DETAILED DESCRIPTION OF THE PREFERRED EMBODIMENTS

The present invention is described in further detail below by referring to preferred examples.

EXAMPLE 1

Figure 6A:
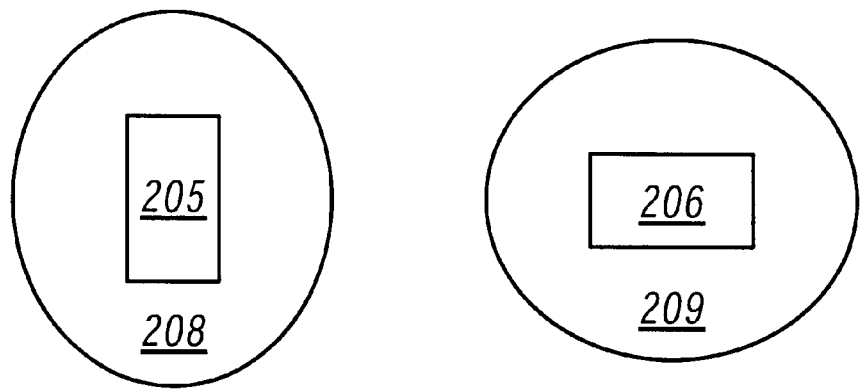
FIGS. 6A to 6C are upper views showing the manufacturing process for a TFT according to an Example of the present invention.
Figure 6B:
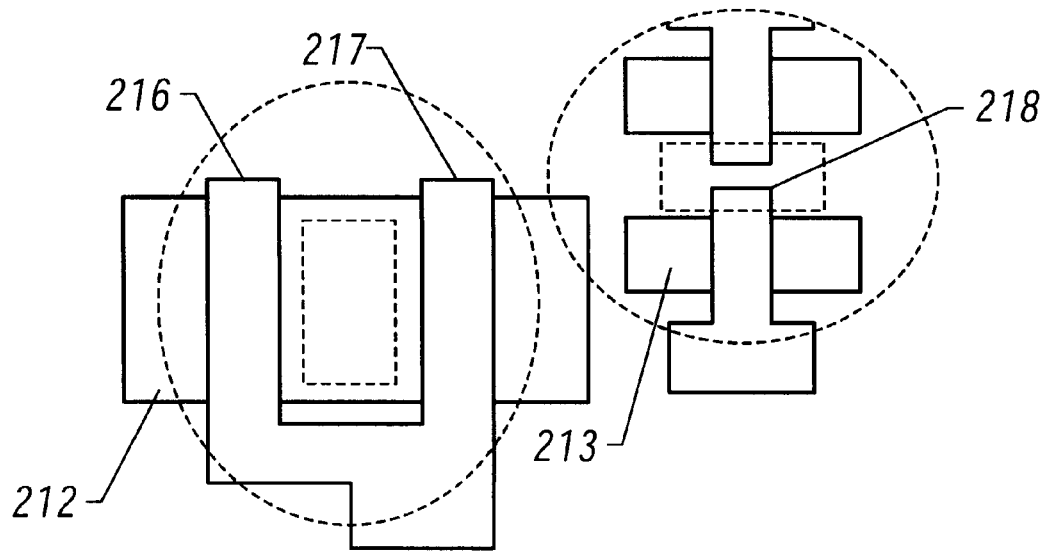
Figure 6C:
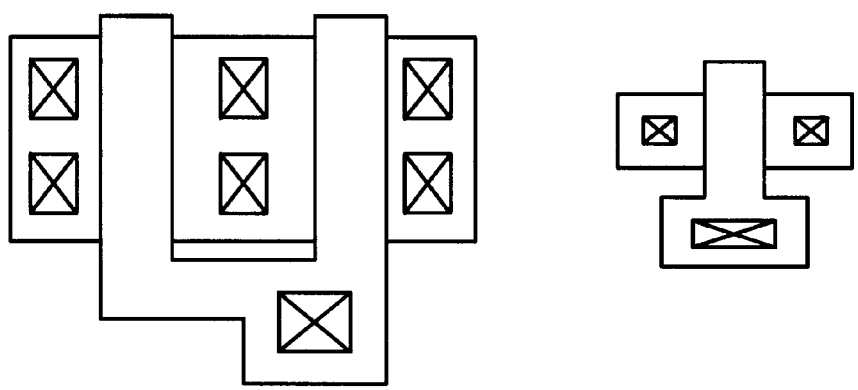

FIGS. 2A to 2F and FIGS. 6A to 6C show an outline of manufacturing process according to the present example. The manufacturing process is described for a circuit having an N-channel type TFT and a P-channel type TFT provided in a complementary structure to constitute a peripheral circuit, and a circuit having an N-channel type TFT to constitute a pixel transistor. FIGS. 2A to 2F are cross section views and FIGS. 6A to 6C are the upper planar views. Although the steps shown in FIGS. 2A to 2F are not in correspondence with those shown in FIGS. 6A to 6C, numerals representing each of the parts are corresponding to each other.

First, a 2,000-Å thick silicon oxide film was formed as an underlying film 202 by means of plasma CVD on a surface-polished quartz substrate 201. Then, a 500-Å thick amorphous silicon film 203 was formed by plasma CVD. A silicon oxide film as a mask film 204 was formed thereon to a thickness of from 1,000 to 3,000 Å, for instance, to a thickness of 2,000 Å, and windows 205 and 206 were formed therein by etching the portions into which the catalyst element (nickel) is to be introduced. Thus, the amorphous silicon film under the windows 205 and 206 portions was exposed.

Before proceeding to the next step, a plurality of such amorphous silicon films were prepared, provided that the substrates, underlying films, amorphous silicon films, and mask films were all obtained in the same manner. By measuring the relation between the temperature for initiating spontaneous crystallization and the time duration, time duration t was expressed by T according to t=f(T). In the present example, the spontaneous crystallization was observed by means of an optical microscope. The manufacturing process was conducted under gaseous nitrogen as in the step of crystallization that is to be carried out later.

An extremely thin oxide film (about several tens of angstrom (Å), not shown) was formed on the surface of the thus exposed amorphous silicon film 203. This thin oxide film was provided to increase the wettability of the amorphous silicon film 203, such that a solution might not be repelled by the surface of the amorphous silicon film 203 in the later step of applying a solution. The oxide film may be formed by, for instance, thermal oxidation process, irradiating an ultraviolet radiation under oxygen atmosphere, or by treating the surface by a strong oxidizing solution such as aqueous hydrogen peroxide.

Figure 1A:
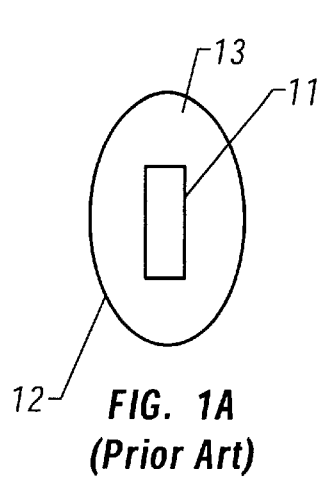
FIGS. 1A to 1D constitute an explanatory diagram to describe how to determine the annealing conditions according to the present invention.
Figure 1B:
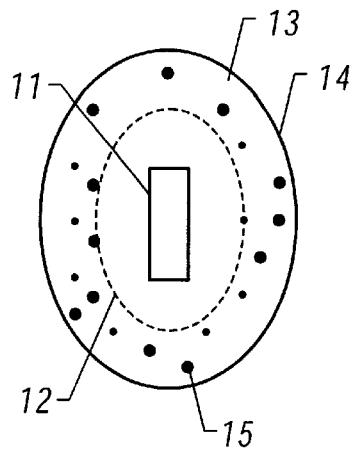
Figure 1C:
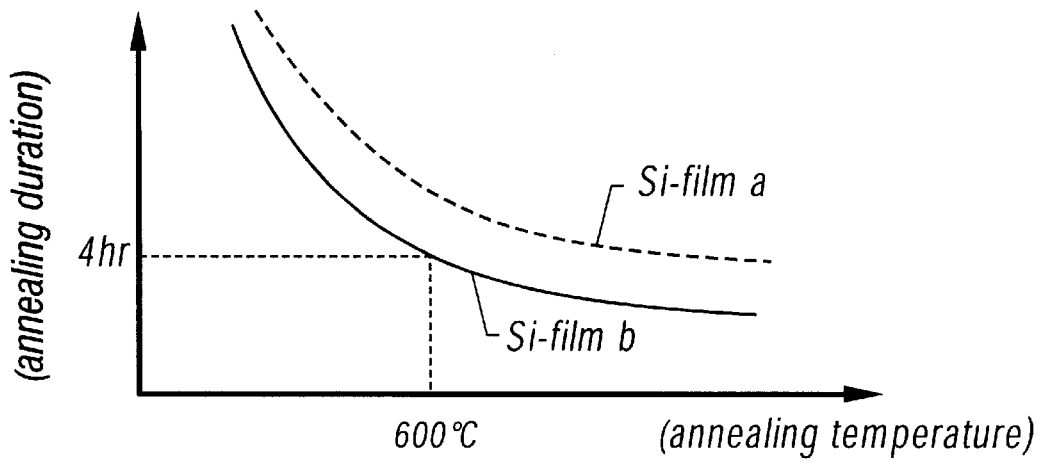
Figure 1D:
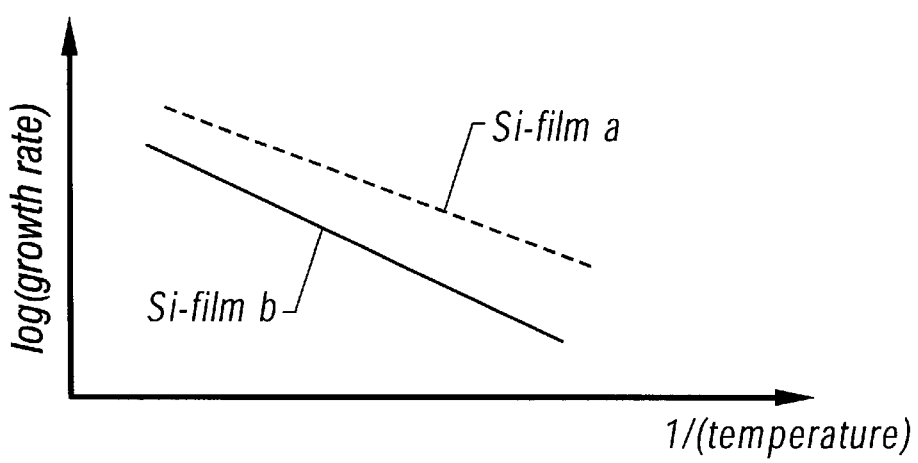
Figure 2A:
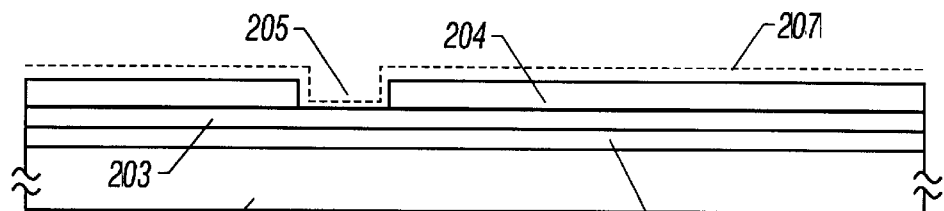
FIGS. 2A to 2F are cross sections views showing the manufacturing process for a TFT according to the present invention.

Then, by applying a nickel acetate solution containing nickel element as the catalyst element which accelerates the crystallization, an extremely thin film 207 of nickel acetate was formed on the surface of the amorphous silicon film 203. The film 207 is so thin that it may not be in the form of a complete film. This step may be carried out by spin coating or spin dry method. The proper concentration of nickel in the acetate solution was found to be in a range of from 1 to 100 ppm (by weight). Thus, the concentration of nickel in this example was set at 10 ppm (FIG. 2A).

Before carrying out the next step of annealing, a plurality of amorphous silicon films formed under the same conditions (provided with the mask film, the windows for introducing nickel, and the nickel acetate film) were prepared, and the relation between the rate of lateral growth and the annealing temperature was investigated. This step was performed under nitrogen atmosphere in the same manner as in the later step of crystallization. Thus, the length of lateral growth x was expressed by T and t according to x=g(T, t). The length of lateral growth necessary in the present example was 100 μm.

A critical annealing temperature T and a critical annealing duration t were obtained by solving the following equation:

$g(T, f(t))=100 \, [\mu m]$

Thus, T=680° C. and t=30 minutes were obtained in this example. From these results, annealing in the present example was carried out at 645° C., corresponding to 95% of the critical annealing temperature, and for a time duration of 29 minutes, corresponding to 97% of the critical annealing duration.

Figure 2B:
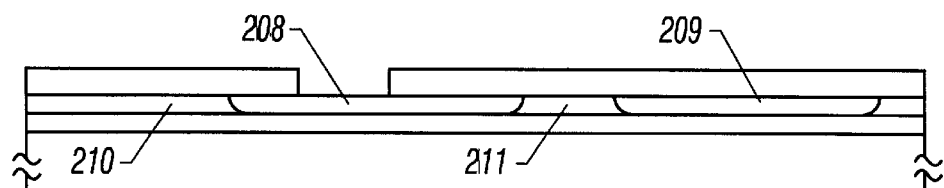

Then, the silicon film 203 was crystallized by performing hot annealing under gaseous nitrogen at 645° C. for a duration of 29 minutes. In the crystallization, crystal growth occurred from the area at which nickel was brought into contact with the silicon film, and proceeded in the direction parallel to the substrate. Referring to FIG. 2B, the regions 208 and 209 are the crystallized regions obtained in this step, whereas regions 210 and 211 are those remaining in the amorphous state. FIG. 6A shows this stage viewed from the upper side (FIG. 2B and FIG. 6A).

In case annealing was performed longer than the time duration defined above, nickel was observed to precipitate at portions distant by 100 μm or more from the windows.

Then, the silicon film 203 was etched to form island-like active layer regions 212 (region of complementary circuit) and 213 (pixel transistor region). Referring to FIG. 6A in this instance, the region just under the windows 205 and 206 located at the center of the oval are regions with a high concentration of nickel, into which nickel is directly introduced. The front ends of crystal growth regions 208 and 209 are also regions with a high nickel concentration. It is clarified that these regions contain nickel at a concentration about ten times as high as the concentration of the crystallized regions present between the front ends of crystal growth.

Although nickel concentration of the silicon film decreases in the later gettering step, it is still preferred to avoid using these regions for the main part of the element. Accordingly, in this example, the active layer regions 212 and 213, and particularly, the channel forming region, should be placed outside the region containing nickel at high concentration. The active layer was etched by means of RIE process having anisotropy in the vertical direction. A typical nickel concentration in the lateral growth region in this state was found to be in a range of from about $10^{17}$ to $10^{19}$ cm$^{-3}$.

Figure 2C:
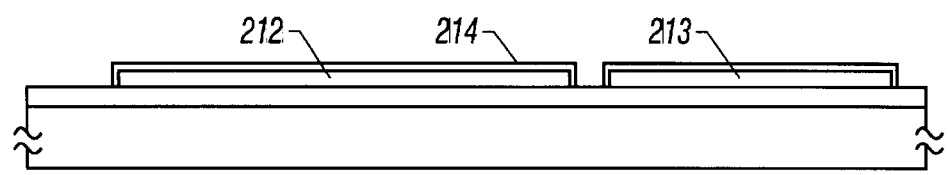

Then, by heating in the temperature range of from 950 to 1,150° C. under an oxidizing atmosphere, a thin (about 200 Å in thickness) silicon oxide film 214 was formed on the surface of the active layers 212 and 213. About 0.1 to 10% of hydrogen chloride was mixed into the gaseous atmosphere. A part of nickel that was present in the silicon film was gettered by an action of hydrogen chloride (FIG. 2C).

Figure 2D:
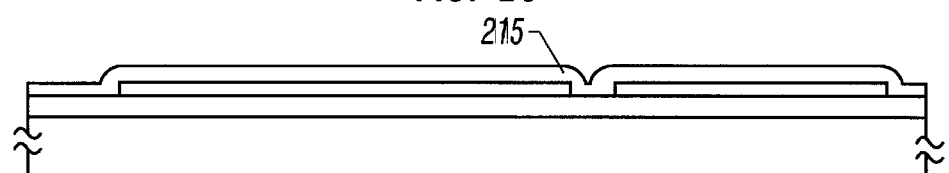

A 1,000-Å thick silicon oxide film 215 was formed as a gate insulating film thereafter by means of plasma CVD. The film was formed at a substrate temperature of from 200 to 400° C., for instance, at 350° C., and by using dinitrogen monoxide and tetraethoxysilane (TEOS) as the gaseous starting materials (FIG. 2D).

Subsequently, a silicon film (containing from 0.1 to 2% of phosphorus) was formed by means of low pressure CVD at a thickness of from 3,000 to 8,000 Å, for instance, at 6,000 Å. Further, it is preferred to conduct the present step of silicon film formation in continuation with the previous film formation step for the silicon oxide film 215. Then, the silicon film is etched to form gate electrodes 216 to 218. The resulting state viewed from the upper side is shown in FIG. 6B. The oval region shown by dotted lines in the figure corresponds to the regions 208 and 209 shown in FIG. 6A.

Then, by means of ion doping, impurities (phosphorus and boron) were implanted into the active layer while using the gate electrodes 216 to 218 as masks. Phosphine ($PH_3$) and diborane ($B_2H_6$) were used as the doping gases. Thus, on using the former, doping was performed under an accelerating voltage in a range of from 60 to 90 kV, for instance, at an accelerating voltage of 80 kV, whereas on using the latter, doping was performed at an accelerating voltage of from 40 to 80 kV, more specifically, at 65 kV. The dose amount in doping was in a range of from $1 \times 10^{15}$ to $8 \times 10^{15}$ $cm^{-2}$; for instance, phosphorus and boron were each doped at dose of $2 \times 10^{15}$ $cm^{-2}$ and $5 \times 10^{15}$ $cm^{-2}$, respectively.

Doping was performed by selectively incorporating the element to the desired regions while covering the other unnecessary regions with a photoresist. N-type impurity regions 220 and 221 as well as P-type impurity region 219 were formed as a result.

Then, the impurities incorporated by ion implantation were activated by annealing; i.e., by irradiating laser light. A KrF excimer laser (irradiated a wavelength of 248 nm and at a pulse width of 20 nsec) was used, but other lasers can be used as well.

Figure 2E:
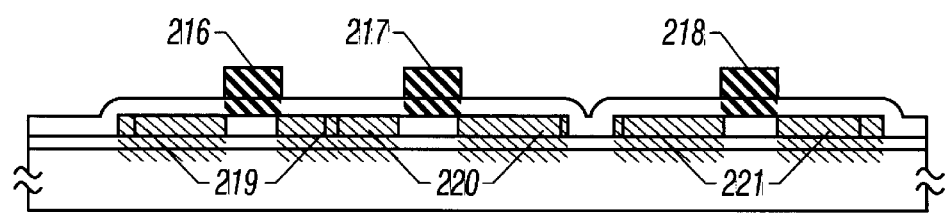

Laser was irradiated 2 to 10 shots per site, for example, 2 shot per site, at an energy density of from 200 to 400 $mJ/cm^2$, for instance, at 250 $mJ/cm^2$. The activation can be conducted more stably by heating the substrate to about 200 to 450° C. while irradiating the laser light (FIG. 2E).

Subsequent to the step above, a silicon oxide film 222 was formed by means of plasma CVD at a thickness of 6,000 Å as an interlayer insulator. Furthermore, a 500-Å thick ITO film was formed thereon by sputtering, which was patterned to form a pixel electrode 223.

Figure 2F:
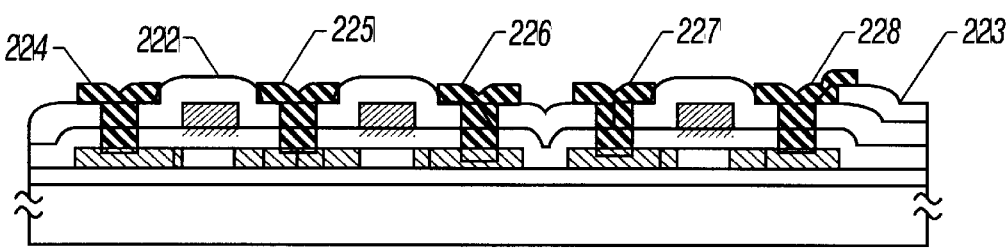
Figure 3:
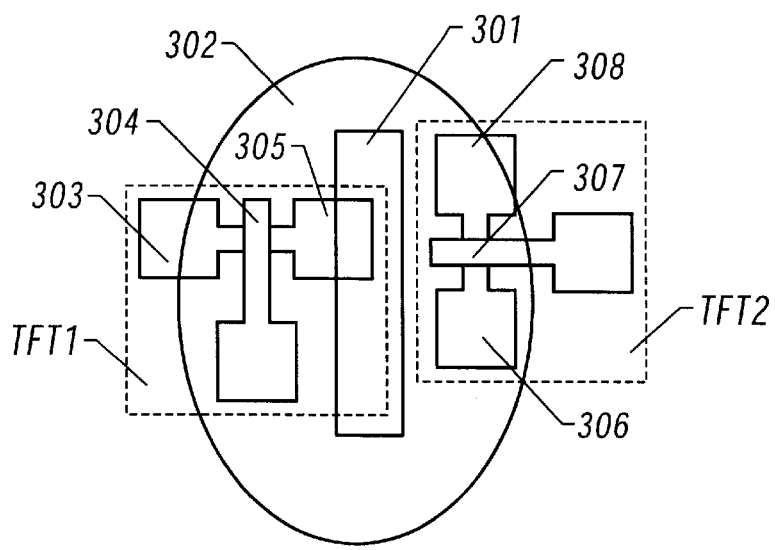
FIG. 3 shows an example of an arrangement of a TFT and a lateral growth region.
Figure 4A:
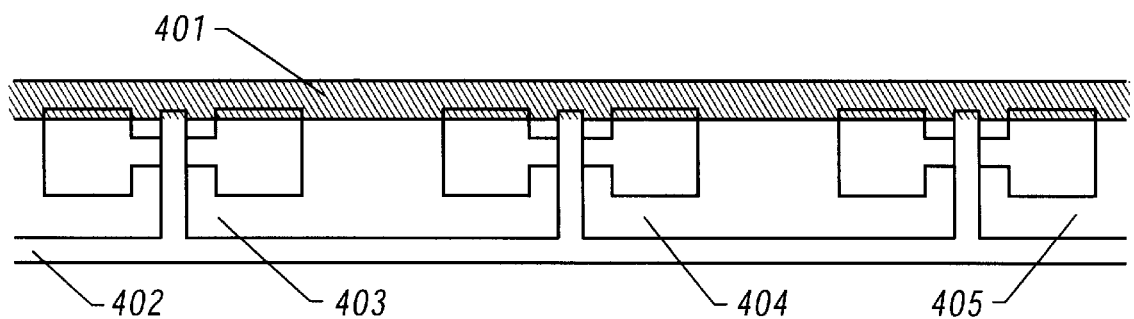
FIGS. 4A and 4B show an example of an arrangement of a TFT and a region of adding a catalyst element.
Figure 4B:
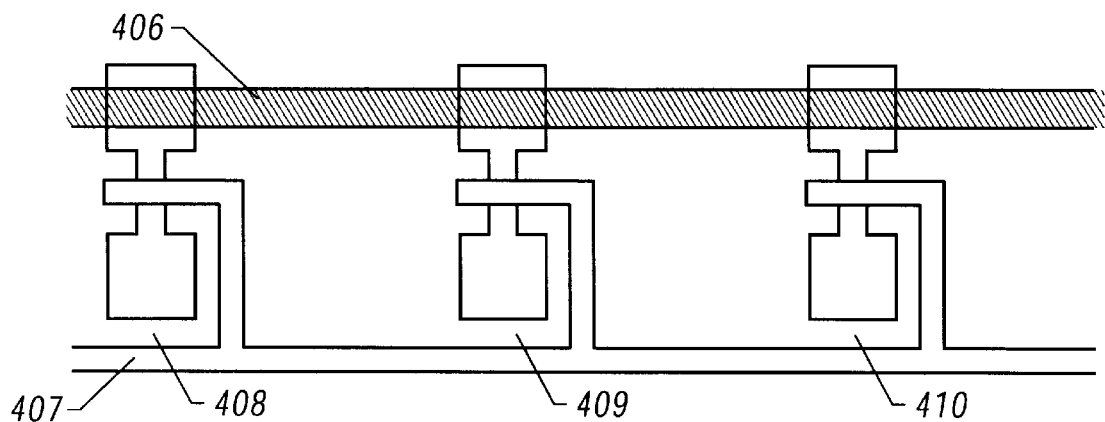

Then, contact holes (the position of perforating them is shown in FIG. 6C) were formed on the interlayer insulator 222 to form electrodes and wirings 224 to 228 for the TFT by using a multilayered film of a metallic material, for instance, of titanium nitride and aluminum. Finally, a complete TFT circuit was obtained by performing annealing for a duration of 30 minutes under hydrogen atmosphere at 1 atm and at 350° C. (FIG. 2F).

As is clearly observed also in FIG. 6B, in the active layer 212, the source/drain are provided in a direction parallel with the direction of crystallization. However, in the active layer 213, the source/drain are provided in a direction vertical to the direction of crystallization. Thus, the TFT formed on the active layer 212 is characterized in that it yields a large ON current, whereas the TFT formed on the active layer 213 is characterized by its small OFF current. In the present example, the two types of TFTs differing in characteristics were formed at positions located relatively near to each other in order to clearly show the constitution of the present invention. As a matter of course, however, the TFTs may be formed at distant locations as in an active matrix circuit.

EXAMPLE 2

In the present example, a process of a basic lateral growth is described.

Figure 8:
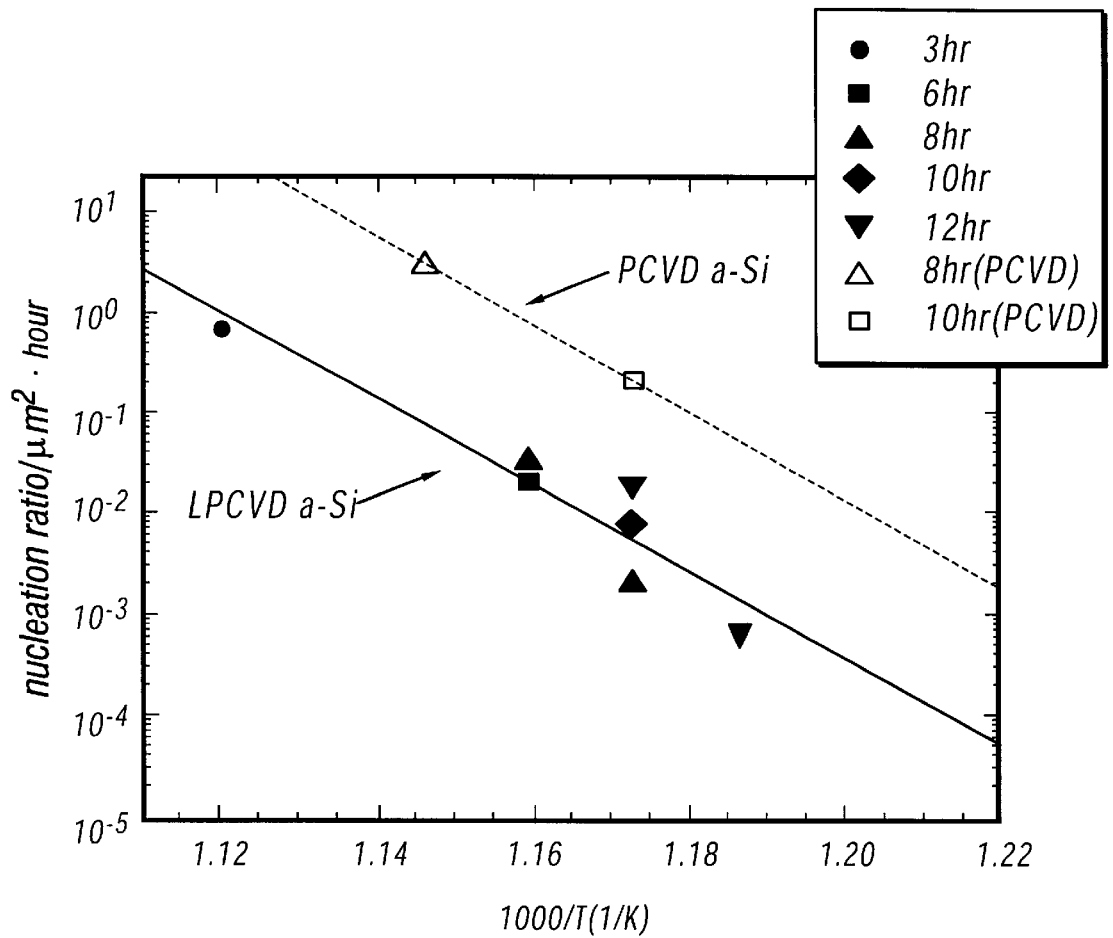
FIG. 8 is a graph showing the relation between heating temperature and spontaneous nucleation rate.
Figure 9:
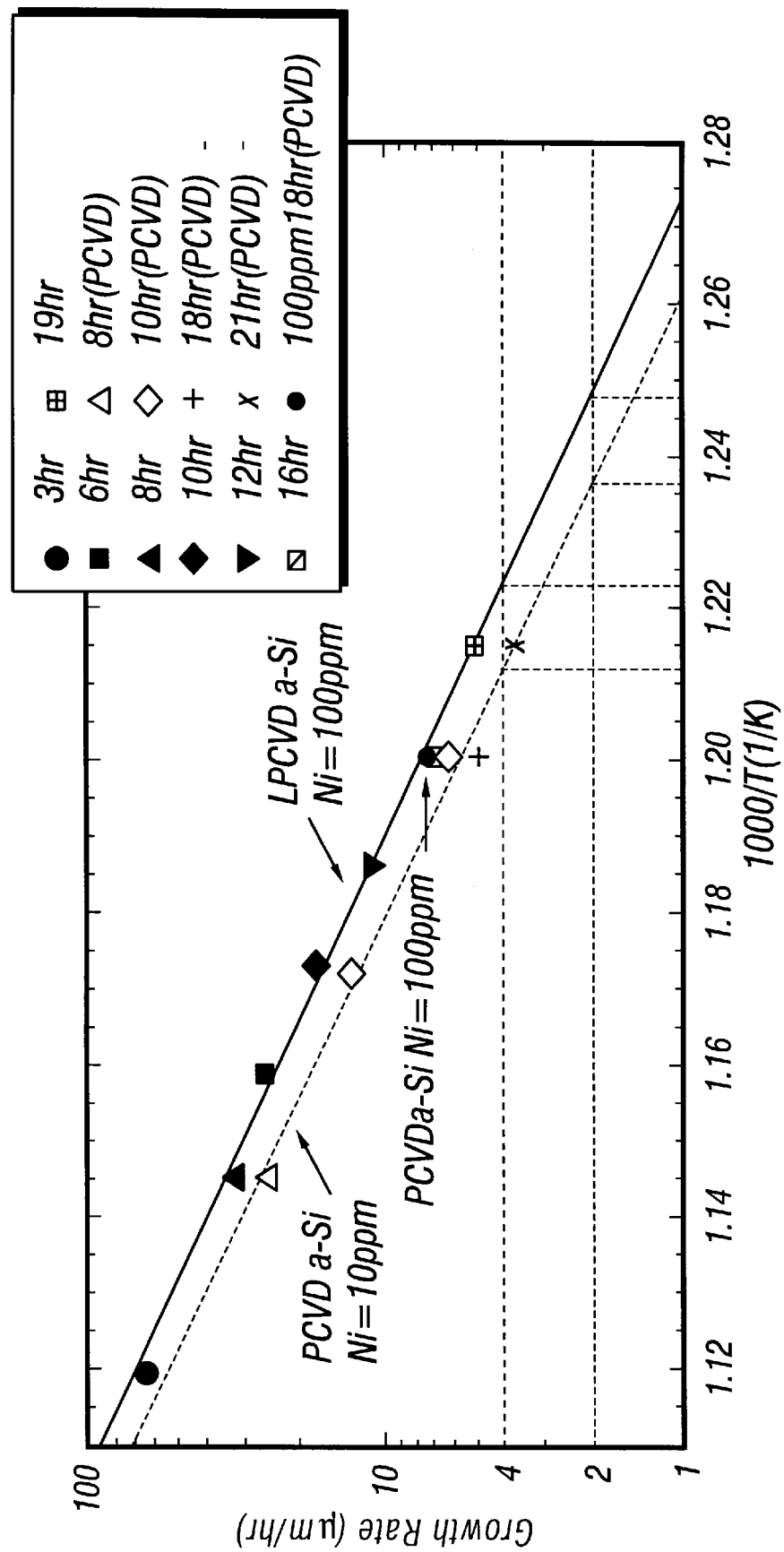
FIG. 9 is a graph showing the relation between heating temperature and the rate of crystal growth in case of lateral growth.

The data shown in FIGS. 8 and 9 are obtained from the samples prepared in accordance with the manufacturing process described in the present example.

Figure 7A:
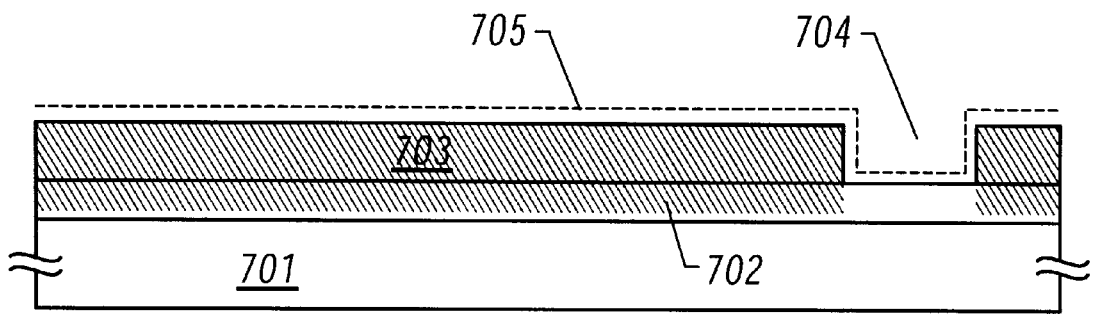
FIGS. 7A to 7D shows a process for crystallizing an amorphous silicon film by lateral growth.

Referring to FIG. 7A, a quartz substrate 701 was prepared at first. A quartz substrate of high purity and having excellent surface flatness must be used. Then, an amorphous silicon film 702 was formed at a thickness of 50 nm (500 Å) on the quartz substrate 701 by means of LPCVD. In this example, LPCVD using disilane for depositing the film was employed.

If PCVD is used instead of LPCVD, a sample for a PCVD a-Si shown in FIGS. 8 and 9 can be obtained.

Once the amorphous silicon film 702 is formed, a 100 nm (1,000 Å) thick silicon oxide film (not shown) was formed by PCVD. By providing an aperture to a part of this silicon oxide film not shown, a silicon oxide mask 703 was formed. An aperture 704 was formed also on the mask 703.

The aperture 704 was formed in a rectangular shape extended in a direction stretching from the portion near to the front of the sheet to the back side of the sheet. The aperture 704 may be formed, for instance, at a width of 20 $\mu$m and a length of 500 $\mu$m. The size of the aperture can be determined by taking the constitution and the arrangement of the circuit, design rules, etc., into consideration.

After forming the mask 703, a nickel acetate solution containing 100 ppm (by weight) of nickel was applied by means of spin coating. Thus was obtained a state in which nickel element is maintained in contact with the surface of the structure as is shown by numeral 705 in FIG. 7A.

Thus was obtained a structure with reference to FIG. 7A; i.e., a state in which nickel element is maintained in contact with the surface of the amorphous silicon film 702 exposed at the portion of the aperture 704.

Heat treatment was performed on the thus obtained structure shown in FIG. 7A. In the present example, a heat treatment at 550° C. under normal pressure gaseous nitrogen atmosphere was performed for a duration of 8 hours. The heating may be applied by changing it stepwise. Heating may be performed by a method using a resistance heater, a method using an infrared radiation heater, etc.

In this step, lateral growth proceeds as is indicated by numeral 70 from the region having an aperture 704 formed thereon. Because T in this case is 823 (K) (T=550+273), the corresponding coordinate in the abscissa of the graph shown in FIG. 9 is read as 1000/T=1.215. Thus, from the graph of FIG. 9, a lateral growth rate of 5 $\mu$m/hr can be obtained. Accordingly, a total distance of lateral growth of 40 $\mu$m results by the heat treatment for 8 hours. That is, the distance of lateral growth shown by numeral 70 in FIG. 7B is 40 $\mu$m.

If the heating temperature is set to 580° C., T is obtained as 853 (K) (T=580+273), and the corresponding coordinate in the abscissa of the graph shown in FIG. 9 is read as 1000/T=1.172. Thus, from the graph, a lateral growth rate of about 18 $\mu$m/hr can be obtained. Accordingly, a total distance of lateral growth of 140 $\mu$m or longer results by the heat treatment for 8 hours.

Figure 7B:
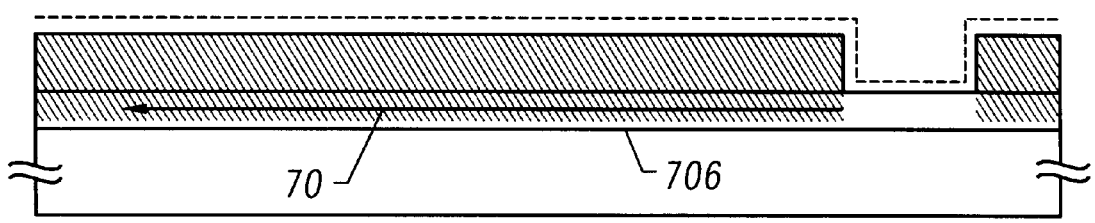

Thus was obtained a crystalline silicon film 706 by lateral growth (FIG. 7B).

Figure 7C:
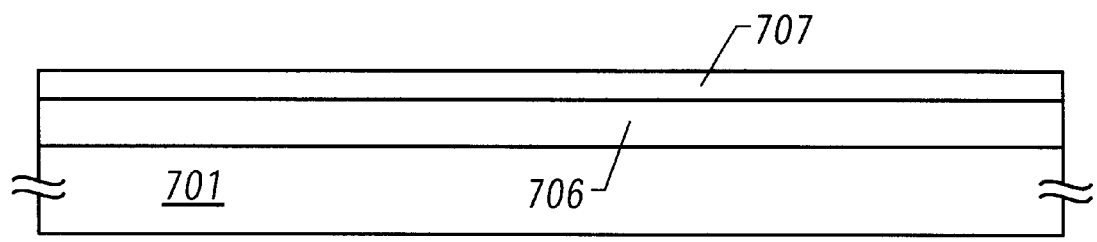

Then, nickel used for the crystallization was removed. In this example, a halogen element was used to remove nickel out from the film. Thus, heat treatment was performed at 950° C. for a duration of 30 minutes under oxygen atmosphere containing 3% by volume of gaseous HCl (FIG. 7C). In this step, nickel was volatilized and removed out of the film in the form of nickel chloride.

At the same time, a 30-nm thick thermal oxide film 707 was formed, and the silicon film was reduced in thickness to 35 nm.

During this heat treatment, not only nickel is removed, but also drastic improvement in crystallinity occurs on the film.

This technology is described in detail in Japanese Patent Application No. 8-335152 filed by the present inventors. The invention described in the present specification is usable in the technology described in the previously filed patent application, and is therefore effective to combine the present invention therewith.

Figure 7D:
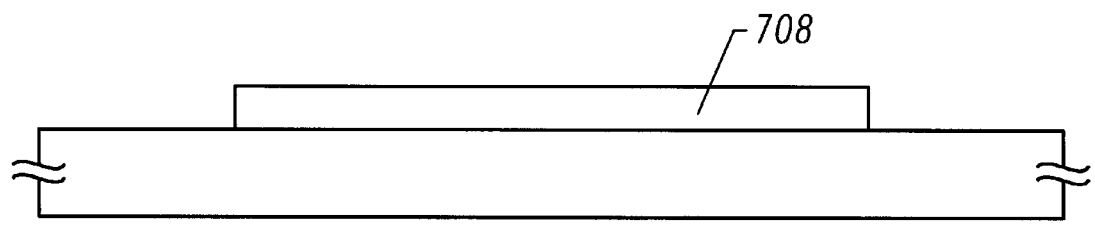

Then, the thermal oxide film 707 was removed, and the silicon film was patterned to the pattern 708 of the active layer of the TFT as shown in FIG. 7D. In this case, the position was determined in such a manner that the laterally grown region may remain.

Thus was obtained the active layer of the TFT using the laterally grown region. The steps subsequent to this one are for manufacturing a TFT using the pattern 708 for the active layer. The TFT which results from the invention disclosed in the present specification is available in both N- and P-channel types. It is also possible to obtain a combined structure comprising the N- and P-channel types. Furthermore, a plurality of TFTs can be integrated to constitute an electronic circuit.

Moreover, TFTs of any structure type, such as a planar type, an inverse stagger type, etc., can be selected. The gate electrode may be formed by freely selecting a material, such as aluminum, silicon material, or a silicide material.

EXAMPLE 3

The present example relates to a manufacturing process similar to that described in Example 2, except for using a glass substrate in the place of quartz substrate. When a glass substrate is used, a heat treatment at temperatures as high as 950° C. cannot be applied to the structure.

In the present example, after crystallization by heat treatment shown in FIG. 2B was completed, phosphorus ions were implanted to the aperture 704 by accelerating then using plasma doping. More specifically, phosphorus ions were implanted accelerated into the region of the aperture 704 by plasma doping using the mask 703. Gettering of nickel by silicon film in the region having thereon the aperture 704 was conducted by applying heat treatment at a temperature of 600° C. for a duration of 2 hours.

Then, the silicon film was patterned as is shown in FIG. 7D. In this case, the region to which nickel was concentrated in the gettering step was removed. In this manner, the concentration of nickel in the active layer pattern 708 using the laterally grown region can be lowered.

Furthermore, because a glass substrate has poor flatness, it is preferred to form a silicon oxide film or a silicon oxynitride film as an underlying film on the substrate before forming thereon the amorphous silicon film.

EXAMPLE 4

The present example relates to a case in which a single crystal silicon wafer or a polycrystalline silicon wafer having thereon an oxide film is used for the substrate.

The invention disclosed in the present specification comprises crystallizing the amorphous silicon film obtained by a vapor phase process. Accordingly, the defects and the like that are present in the substrate at high density have no influence on the process. Thus, the manufacturing cost can be reduced by using a lower quality and cheaper single crystal silicon wafer or a polycrystalline silicon wafer.

EXAMPLE 5

The present example relates to a case of manufacturing an operational amplifier by integrating a plurality of TFTs using the laterally grown films obtained by using the present invention as is disclosed in the present specification. The constitution described below is an example which effectively utilizes lateral growth.

Figure 10:
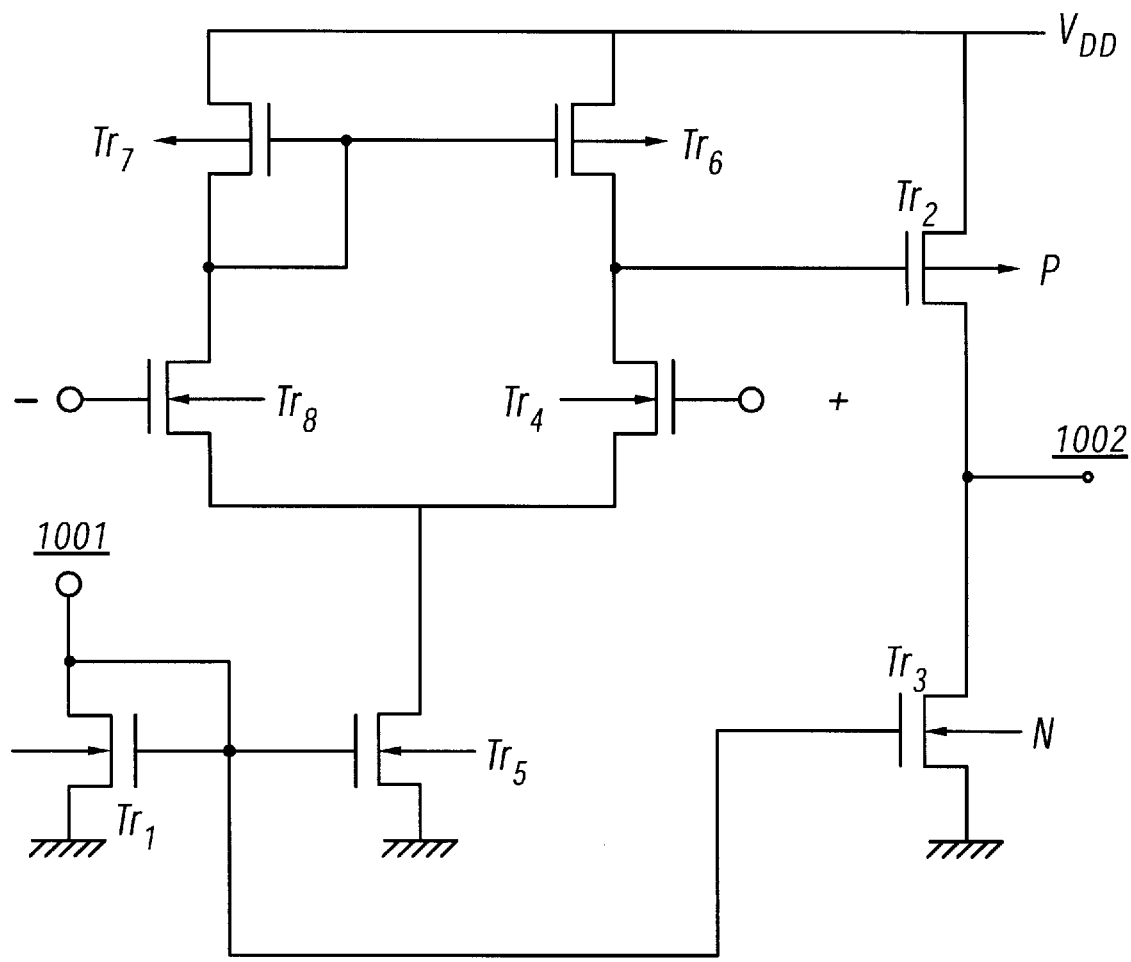
FIG. 10 shows an equivalent circuit of an operational amplifier constituted by TFTs.
Figure 11:
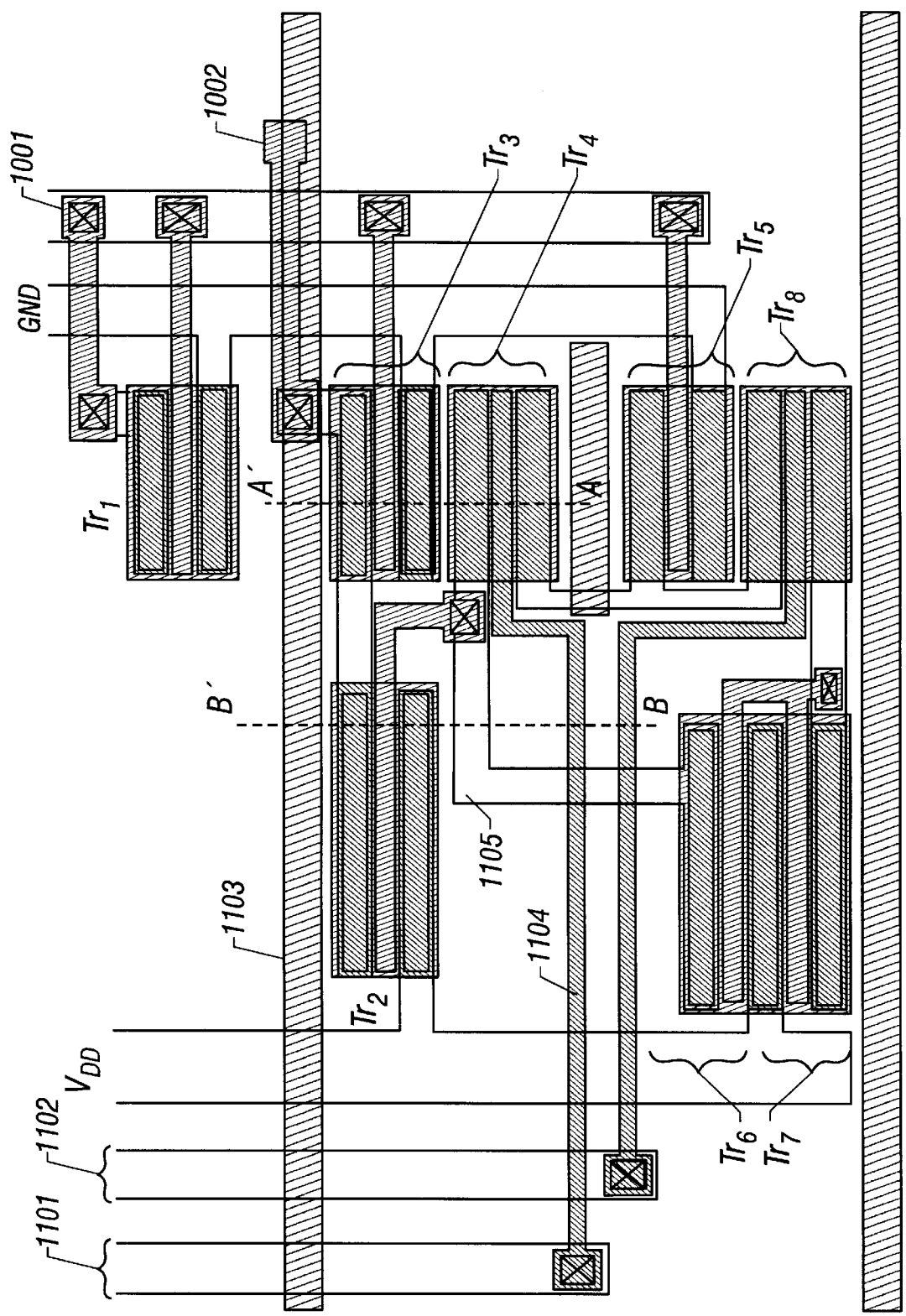
FIG. 11 shows a mask pattern for an operational amplifier constituted by TFTs.

FIG. 10 shows an internal equivalent circuit of an operational amplifier constructed by thin film transistors according to the present example. FIG. 11 shows a mask pattern diagram of the operational amplifier circuit expressed by the equivalent circuit shown in FIG. 10. Referring to the figures, the structure comprises transistors $Tr_1$ to $Tr_8$, a bias input 1001, an output 1002, a positive (+) input 1101, a negative (−) input 1102, a nickel adding region 1103, a first layer wiring 1104, and a second layer wiring 1105.

Figure 12A:
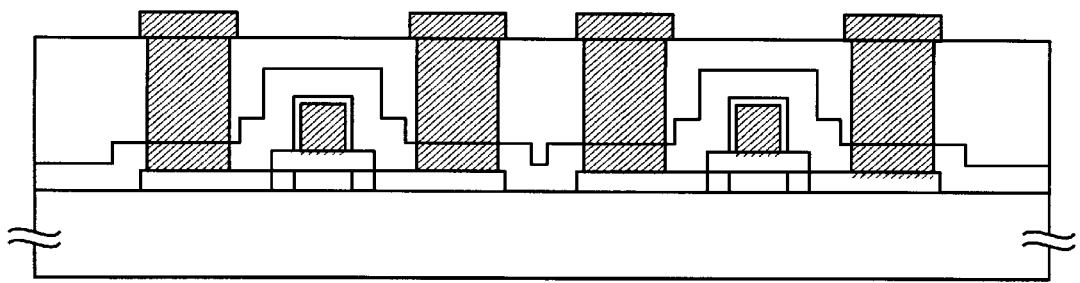
FIGS. 12A and 12B show cross sections of an operational amplifier constituted by TFTs.
Figure 12B:
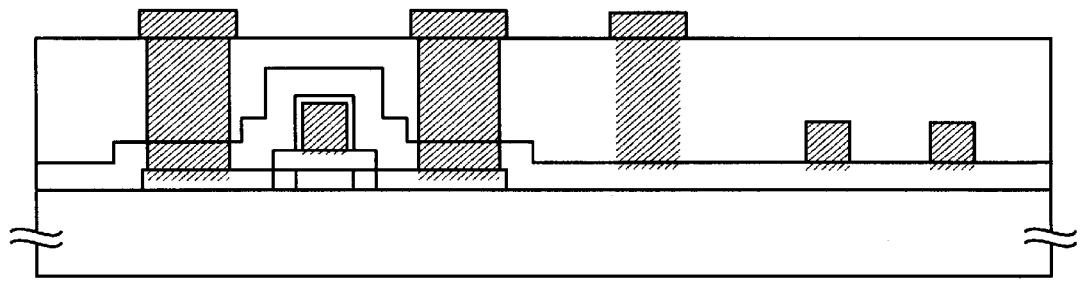

FIG. 12A is the cross section view seen along the line A–A' of FIG. 11. FIG. 12B is the cross section view seen along the line B–B' of FIG. 11.

In the present example, nickel was introduced into a narrow region of 10 μm in width denoted as the nickel adding region. The method of introducing nickel is basically the same as that described in Example 1.

Then, crystallization of amorphous silicon film was allowed to take place from the nickel adding region by lateral growth. The resulting laterally grown region was then used in the constitution of the thin film transistor.

In a circuit structure shown in FIG. 10, the key is that the characteristics of $Tr_8$ are well comparable to those of $Tr_4$ constituting the differential circuit of the input portion. In the present example, the active layer constituting $Tr_8$ and $Tr_4$ are patterned and arranged in such a manner that they may be positioned equidistant from the nickel adding region. In this manner, the difference in characteristics attributed to the difference in distance of crystal growth was canceled out.

Furthermore, concerning the arrangement of the active layers constituting $Tr_6$ and $Tr_7$, the active regions are formed at portions differing in distance of crystal growth (i.e., the distance from the nickel adding region), because they use crystal growth from the same nickel adding region. This causes slight difference in the properties of $Tr_6$ and $Tr_7$, however, the difference in characteristics in two transistors is not regarded as serious problem in constituting a circuit.

EXAMPLE 6

The present example refers briefly to devices consisting of TFTs manufactured in accordance with the invention disclosed in the present specification. FIGS. 14A to 14F each schematically show the devices.

Figure 14A:
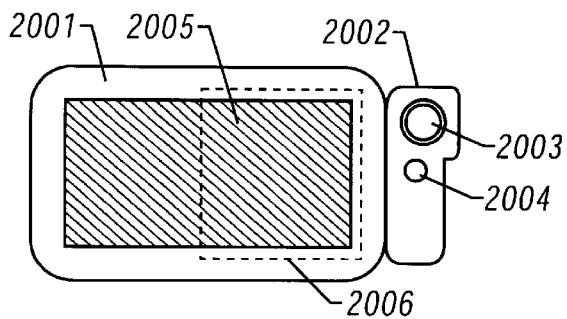
FIGS. 14A to 14F each show a constitution of a semiconductor device utilizing a TFT.

FIG. 14A shows a portable information terminal having a communication function using telephone lines.

The electronic device is equipped with an integrated circuit 2006 using thin film transistors in the interior of the main body 2001, and is provided with an active matrix type liquid crystal display 2005, a camera portion 2002 to input image, an image receiving portion 2003, and an operation switch 2004.

Figure 14B:
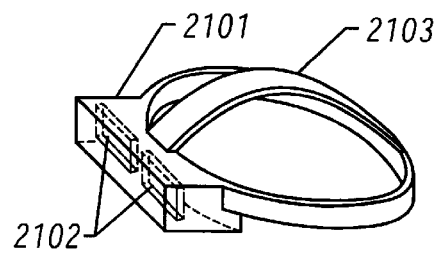

FIG. 14B shows an electronic device known as head mount display (HMD). An HMD comprises a main body 2101 that is mounted and attached on the human head by a strap 2103, and displays a virtual image in the front of the eyes. The image is produced by liquid crystal display devices 2102 each corresponding to the left and the right eyeballs.

The electronic device above utilizes thin film transistors to make it more compact and light weight.

Figure 14C:
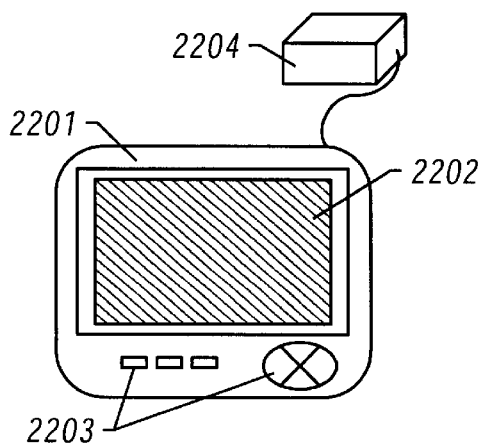

FIG. 14C displays map information and various other pieces of information based on the signal sent from an artificial satellite. The information sent from the satellite and captured by an antenna 2204 is processed in the electronic circuit provided inside the body 2201, and the necessary information is displayed on the liquid crystal display device 2202.

Figure 14D:
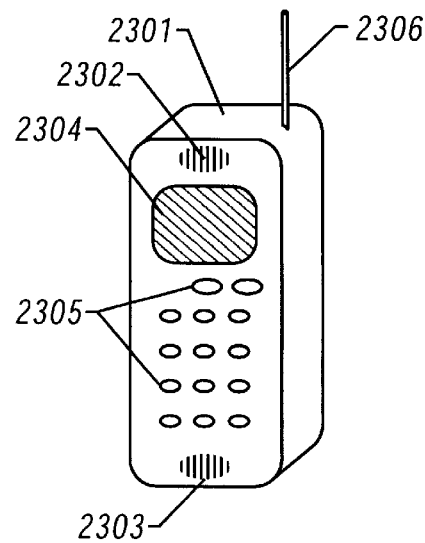

The device is operated by an operation switch 2203. Also in this device, circuits using thin film transistors are employed to make the entire constitution compact. FIG. 14D shows a personal handyphone system. The electronic device comprises a main body 2301 equipped with an antenna 2306, a voice output (speaker) portion 2302, a liquid crystal display portion 2304, an operation switch 2305, and a voice input (microphone) portion 2303.

Figure 14E:
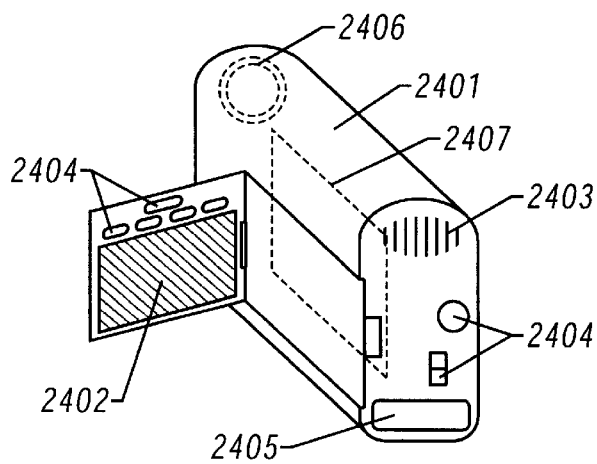

The electronic device shown in FIG. 14E is a portable camera device known as a "video camera". The electronic device comprises a main body 2401 equipped with a liquid crystal display 2402 assembled to a shutter member, and an operation switch 2404 also provided to the shutter member.

Furthermore, the main body 2401 is equipped with an image receiving portion 2406, an integrated circuit 2407, a voice input portion 2403, an operation switch 2404, and a battery 2405.

Figure 14F:
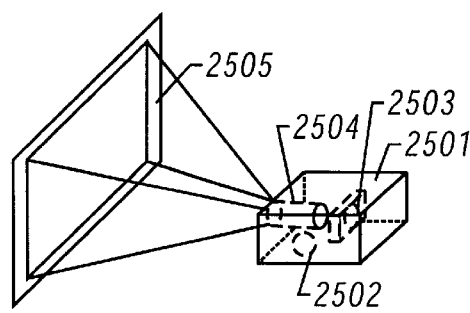
Figure 2A:
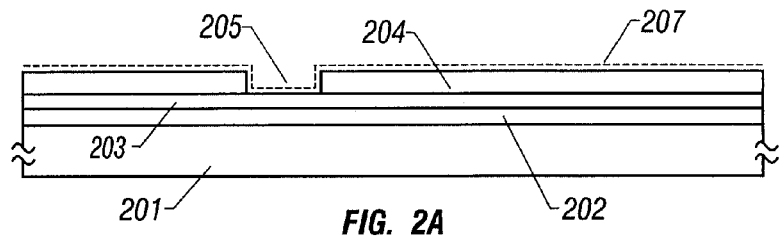
Figure 2B:
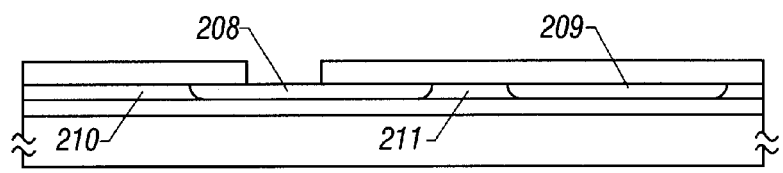
Figure 2C:
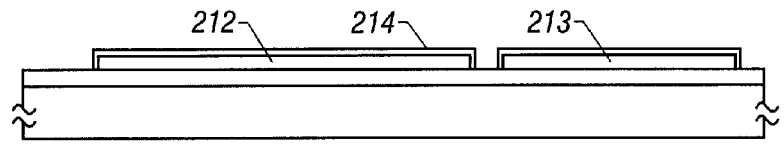
Figure 2D:
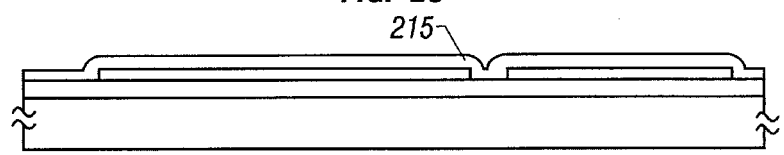
Figure 2E:
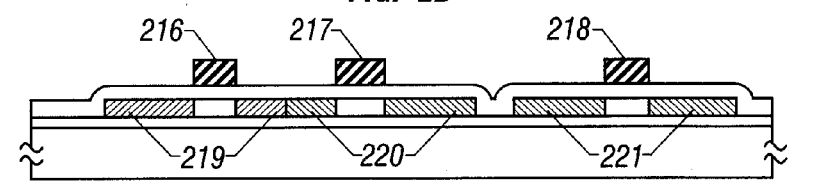
Figure 2F:
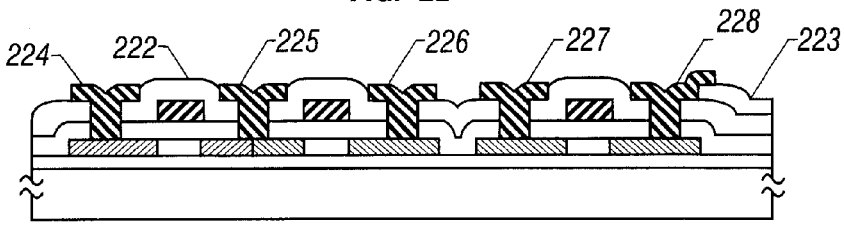
Figure 5:
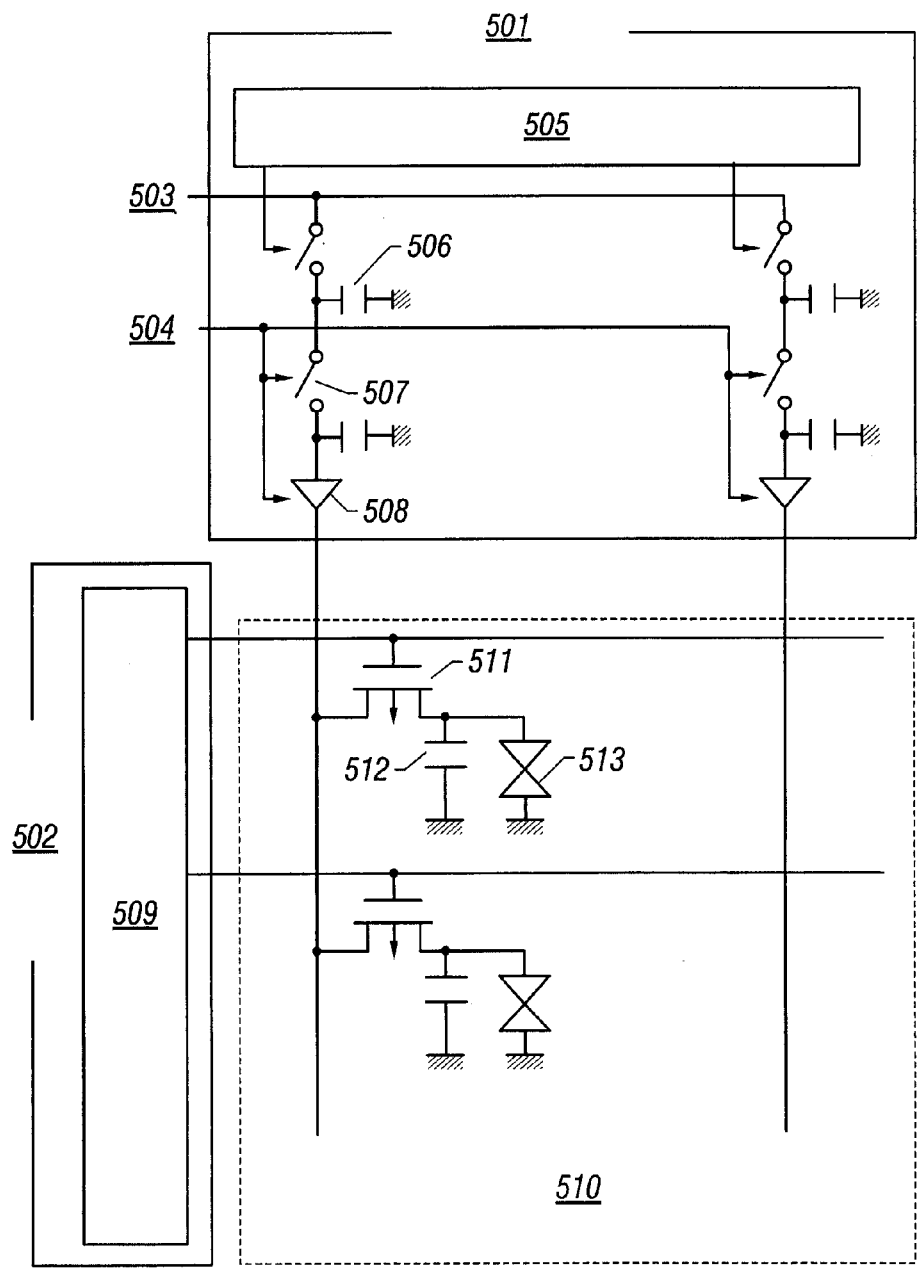
Figure 7A:
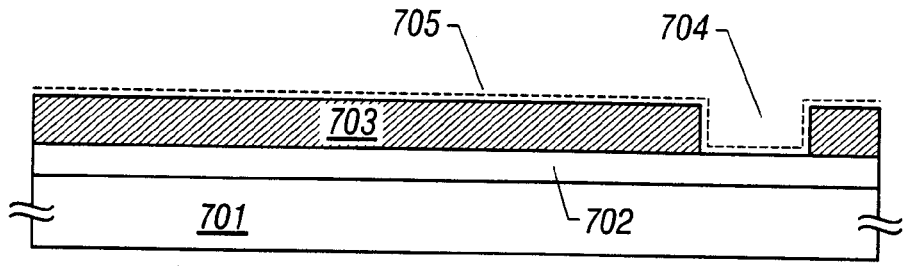
Figure 7B:
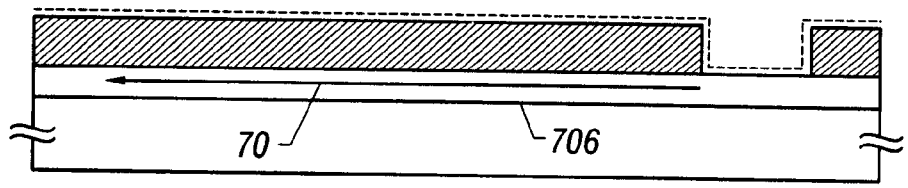
Figure 7C:
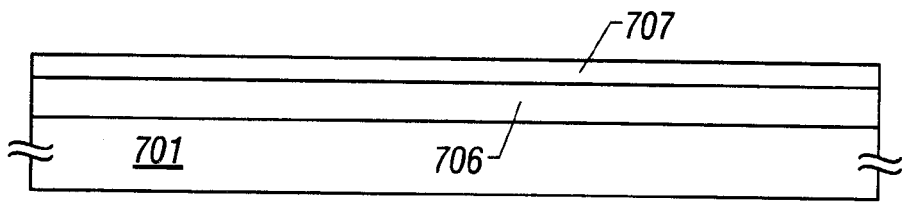
Figure 7D:
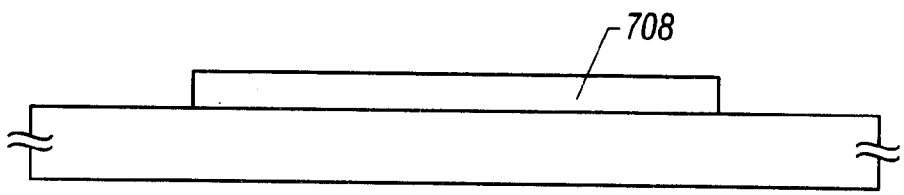
Figure 12A:
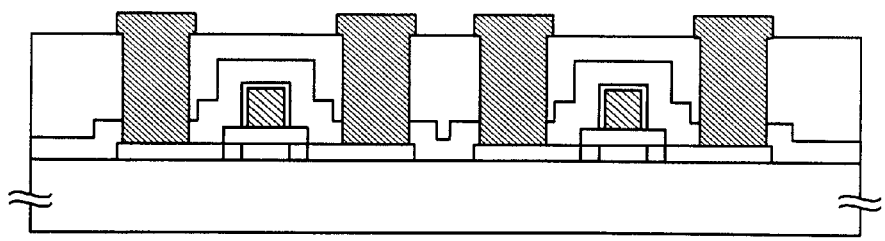
Figure 12B:
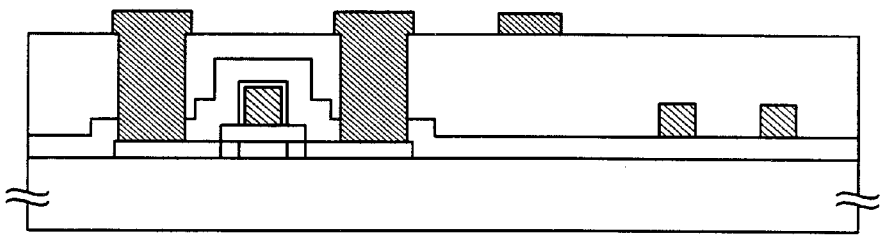
Figure 13:
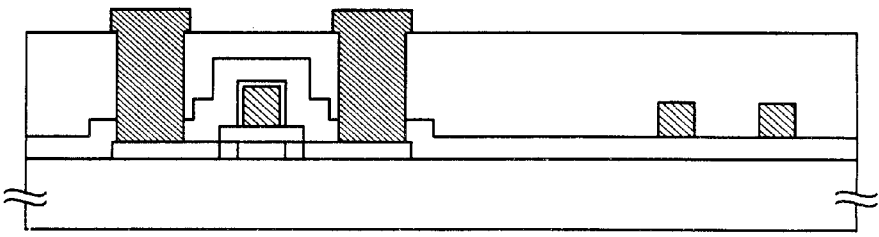

In FIG. 14F shows a projection type liquid crystal display device. The device comprises a main body 2501, which is equipped with a light source 2502, a liquid crystal display device 2503, and an optical system 2504, so that an image may be projected to a screen 2505.

As the liquid crystal devices for use in the electronic devices above, either of the transmitting type and reflection type can be used. From the viewpoint of display characteristics, the transmittance type is superior to the reflection type. However, the reflection type is more advantageous when a more compact and light weight device with less power consumption is required.

Furthermore, for the display device, a flat panel display such as an active matrix type EL (electroluminescent) display, a plasma display, etc., can be used as well.

As described in detail above, the present invention provides a crystalline silicon film free from deterioration in film quality (i.e., no precipitation of catalyst elements observed) even when the length of lateral growth is increased. That is, by employing the invention disclosed in the present specification, the lateral growth of amorphous silicon film using nickel can be accelerated while expelling the influence of spontaneous crystallization. At the same time, the lateral growth is allowed at a practically feasible growth rate.

The silicon film thus obtained are extremely useful in the constitution of semiconductor devices and semiconductor integrated circuits. Furthermore, by using laterally grown regions, circuits operating at a high speed of 100 MHz or higher can be constructed using TFTs. Such a circuit is well comparable to an integrated circuit manufactured by using a single crystal silicon wafer.

The invention disclosed herein greatly contributes to the improvement of, not only the quality and reproducibility, but also the reliability, of the TFTs obtained by the lateral growth method. Thus, the present invention is highly useful in the industry.

While the invention has been described in detail by referring to specific examples, it should be understood that any changes or modifications can be made without departing from the scope of the present invention.

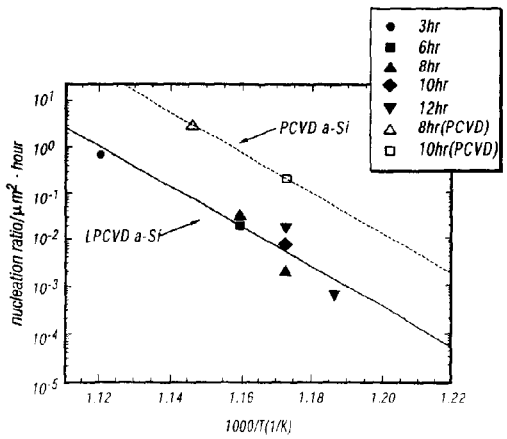

What is claimed is:

1. A method for manufacturing a semiconductor comprising:

crystallizing a semiconductor film comprising silicon formed over a substrate by employing lateral growth method and thereby annealing at a temperature $T_0$ (° C.) using at least one catalyst element which accelerates the crystallization, wherein duration of the annealing is 90% or more but less than 100% of duration to necessary to initialize the crystallization of the semiconductor film at the temperature $T_0$ (° C.) under a condition that the catalyst element is not used, wherein each of the terms $T_0$ and $t_0$ represents a specific value.

2. A method for manufacturing a semiconductor comprising:

forming a first semiconductor film comprising silicon over a first substrate;

obtaining a first equation, $t=f(T)$, which relates a first annealing-temperature T (° C.) to a first annealing-duration t (hours) in case of the first semiconductor film without using at least one catalyst element for accelerating crystallization;

forming a second semiconductor film comprising silicon over a second substrate;

obtaining a second equation, $x=g(T,t)$, which relates a second annealing-temperature T (° C.) and the second annealing-duration t (hours) to a laterally-grown distance x ($\mu$m), when a lateral growth using the catalyst element is applied to the second semiconductor film;

specifying an annealing-duration $t_0$ (hours) and an annealing-temperature $T_0$ (° C.) which satisfy said first equation and said second equation, when a laterally-grown distance $x_0$ ($\mu$m) is determined; and performing annealing at a temperature not higher than the annealing-temperature $T_0$ (° C.), and thereby laterally growing a third semiconductor film comprising silicon by using the catalyst element, wherein each of the terms T, t and x represents a variable, and each of the terms $t_0$, $T_0$, and $x_0$ represents a specific value.

3. A method for manufacturing a semiconductor as claimed in claim 1 or 2, wherein the catalyst element is at least one selected from the group consisting of Ni, Pd, Pt, Cu, Ag, and Fe.

4. A method for manufacturing a crystalline semiconductor comprising:

forming a semiconductor film comprising silicon over an insulating surface by means of low pressure thermal CVD process;

selectively introducing nickel element into a partial area of the semiconductor film comprising silicon; and applying heat treatment and thereby allowing crystal growth to occur in a direction parallel to a surface of the semiconductor film from the area into which the nickel element is selectively introduced, wherein the heat treatment is performed in a temperature range from 536 to 585° C., and the crystal growth is performed in a rate from 2 $\mu$m/hr to 20 $\mu$m/hr, and spontaneous nucleation rate per 1 $\mu$m$^2$ during the heat treatment is 10$^{-2}$ nuclei or less per 1 hour.

5. A method for manufacturing a crystalline semiconductor comprising the steps of:

forming a semiconductor film comprising silicon over an insulating surface by means of plasma CVD process;

selectively introducing nickel element into a partial area of the semiconductor film; and applying heat treatment and thereby allowing crystal growth to occur in a direction parallel to a surface of the semiconductor film from the area into which the nickel element is selectively introduced, wherein the heat treatment is performed in a temperature range of from 536 to 559° C., and the crystal growth is performed in a rate of from 2 $\mu$m/hr to 7 $\mu$m/hr.

6. A method of claim 5, wherein spontaneous nucleation rate per 1 $\mu$m$^2$ during the heat treatment is 10$^{-2}$ nuclei or less per 1 hour.

7. A method for manufacturing a semiconductor device comprising:

forming a semiconductor film comprising silicon over an insulating surface by means of low pressure thermal CVD process;

selectively introducing nickel element into a partial area of the semiconductor film comprising silicon; and applying heat treatment for crystal growth from an area where the nickel element is selectively introduced to a direction being parallel to a surface of the semiconductor film, wherein the heat treatment is performed in a temperature range from 536 to 585° C., and the crystal growth is performed in a rate from 2 $\mu$m/hr to 20 $\mu$m/hr, and spontaneous nucleation rate per 1 $\mu$m$^2$ during the heat treatment is 10$^{-2}$ nuclei or less per 1 hour.

8. A method for manufacturing a semiconductor device comprising the steps of:

forming a semiconductor film comprising silicon over an insulating surface by means of plasma CVD process;

selectively introducing nickel element into a partial area of the semiconductor film; and applying heat treatment for crystal growth from an area where the nickel element is selectively introduced to a direction being parallel to a surface of the semiconductor film, wherein the heat treatment is performed in a temperature range of from 536 to 559° C., and the crystal growth is performed in a rate of from 2 $\mu$m/hr to 7 $\mu$m/hr.

9. A method of claim 8, wherein spontaneous nucleation rate per 1 $\mu$m$^2$ during the heat treatment is 10$^{-2}$ nuclei or less per 1 hour.

10. A method of claim 7, wherein said semiconductor device is an EL display device.

11. A method of claim 8, wherein said semiconductor device is an EL display device.

12. A method for manufacturing a semiconductor device comprising:

forming a semiconductor film comprising silicon over an insulating surface by means of plasma CVD process;

selectively forming a film comprising a material in contact with a partial area of the semiconductor film; and applying heat treatment for crystal growth from an area where the film comprising the material is selectively formed to a direction being parallel to a surface of the semiconductor film, wherein the heat treatment is performed in a temperature range from 536 to 559° C., and the crystal growth is performed in a rate from 2 $\mu$m/hr to 7 $\mu$m/hr.

13. A method of claim 12, wherein said material is at least one selected from a group consisting of Ni, Pd, Pt, Cu, Ag, and Fe.

14. A method of claim 12, wherein spontaneous nucleation rate per 1 $\mu$m$^2$ during the heat treatment is 10$^{-2}$ nuclei or less per 1 hour.

15. A method of claim 12, wherein said semiconductor device is a liquid crystal display device incorporated into a device selected from a group consisting of a portable information terminal, a head mount display, a personal hanyphone system, a portable camera device, a projection type liquid crystal display device.

16. A method of claim 12, wherein said semiconductor device is an EL display device.

17. A method for manufacturing a semiconductor device comprising:

forming a semiconductor film comprising silicon over an insulating surface by means of low pressure thermal CVD process;

selectively forming a film comprising a material in contact with a partial area of the semiconductor film; and applying heat treatment for crystal growth from an area where the film comprising the material is selectively formed to a direction being parallel to a surface of the semiconductor film, wherein the heat treatment is performed in a temperature range from 536 to 585° C., and the crystal growth is performed in a rate from 2 $\mu$m/hr to 20 $\mu$m/hr, and spontaneous nucleation rate per 1 $\mu$m$^2$ during the heat treatment is 10$^{-2}$ nuclei or less per 1 hour.

18. A method of claim 17, wherein said material is at least one selected from a group consisting of Ni, Pd, Pt, Cu, Ag, and Fe.

19. A method of claim 17, wherein spontaneous nucleation rate per 1 $\mu$m$^2$ during the heat treatment is 10$^{-2}$ nuclei or less per 1 hour.

20. A method of claim 17, wherein said semiconductor device is a liquid crystal display device incorporated into a device selected from a group consisting of a portable information terminal, a head mount display, a personal hanyphone system, a portable camera device, a projection type liquid crystal display device.

21. A method of claim 17, wherein said semiconductor device is an EL display device.

* * * * *

UNITED STATES PATENT AND TRADEMARK OFFICE
CERTIFICATE OF CORRECTION

Figure 5:
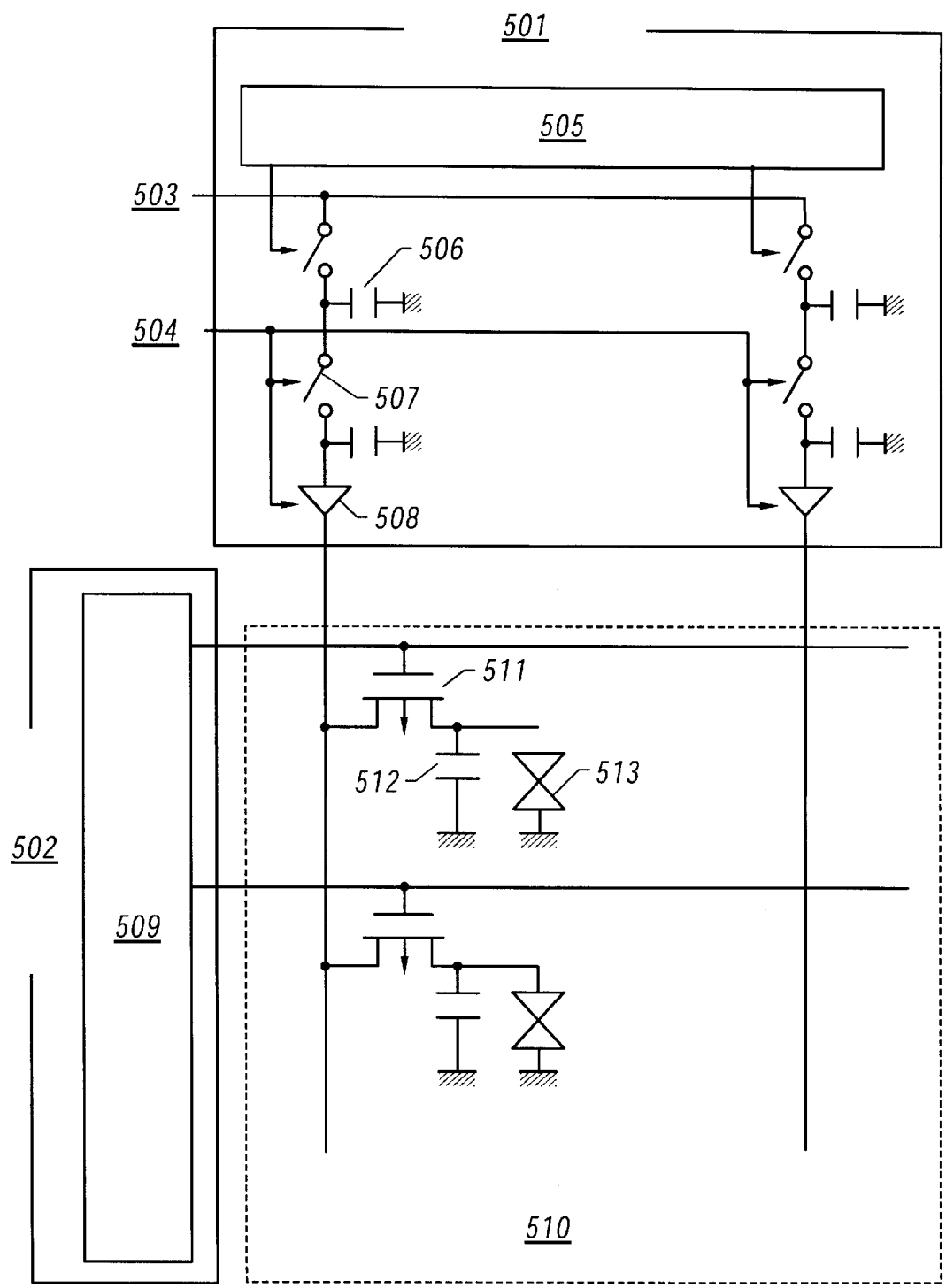
FIG. 5 shows a scheme of an active matrix circuit of a monolithic type.
Figure 13:
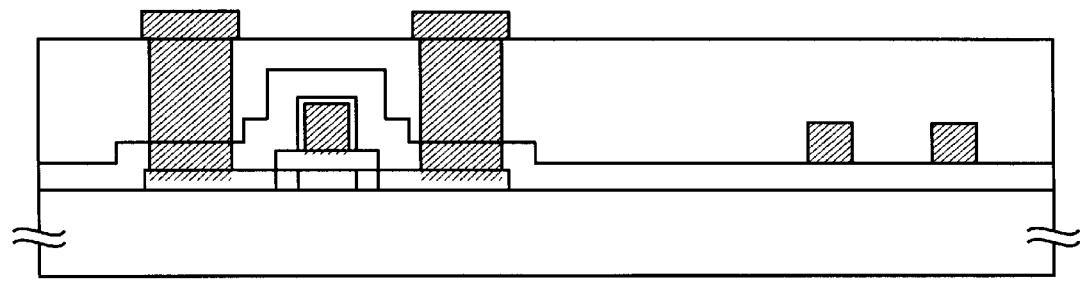
FIG. 13 shows a cross section of an operational amplifier constituted by TFTs.

PATENT NO.   : 6,140,166
DATED        : October 31, 2000
INVENTOR(S)  : Hisashi Ohtani, Tamae Takamo, Taketomi Asami and Etsuko Fujimoto It is certified that error appears in the above-identified patent and that said Letters Patent is hereby corrected as shown below:

Drawings,
Substitute the attached FIGs. 2A-2F (Sheet 2 of 12); FIG. 5 (Sheet 4 of 12); FIGs. 7A-7D (Sheet 6 of 12); and FIGs. 12A, 12B, and 13 (Sheet 11 of 12) as shown on the attached 4 pages. Substitute FIG. 2F represented on the front page of the patent.

Signed and Sealed this

Nineteenth Day of November, 2002

Attest:

Attesting Officer

JAMES E. ROGAN
Director of the United States Patent and Trademark Office

United States Patent [19]
Ohtani et al.

[11] Patent Number: 6,140,166
[45] Date of Patent: Oct. 31, 2000

[54] METHOD FOR MANUFACTURING SEMICONDUCTOR AND METHOD FOR MANUFACTURING SEMICONDUCTOR DEVICE

[75] Inventors: Hisashi Ohtani; Tamae Takano; Taketomi Asami; Etsuko Fujimoto, all of Kanagawa, Japan

[73] Assignee: Semicondutor Energy Laboratory Co., Ltd., Kanagawa-ken, Japan

[21] Appl. No.: 08/997,910

[22] Filed: Dec. 24, 1997

[30] Foreign Application Priority Data

Dec. 27, 1996 [JP] Japan .................................. 8-358972
Mar. 13, 1997 [JP] Japan .................................. 9-078979

[51] Int. Cl.$^7$ .............................. H01L 21/00; H01L 21/20
[52] U.S. Cl. .......................................... 438/166; 438/486
[58] Field of Search ............................... 438/486, 166

[56] References Cited

U.S. PATENT DOCUMENTS

| | | |
|---|---|---|
| 5,403,772 | 4/1995 | Zhang et al. . |
| 5,534,716 | 7/1996 | Takemura . |
| 5,563,426 | 10/1996 | Zhang et al. . |
| 5,605,846 | 2/1997 | Ohtani et al. ............... 437/174 |
| 5,643,826 | 7/1997 | Ohtani et al. . |
| 5,879,977 | 3/1999 | Zhang et al. ............... 438/166 |
| 5,888,857 | 3/1999 | Zhang et al. . |
| 5,922,125 | 7/1999 | Zhang ........................... 117/9 |
| 5,923,962 | 7/1999 | Ohtani et al. . |
| 5,942,768 | 8/1999 | Zhang . |

FOREIGN PATENT DOCUMENTS

| | | |
|---|---|---|
| 7-045519 | 2/1995 | Japan . |
| 7-066425 | 3/1995 | Japan . |
| 7-130652 | 5/1995 | Japan . |
| 7-335548 | 12/1995 | Japan . |
| 8-213634 | 8/1996 | Japan . |
| 9-312260 | 12/1997 | Japan . |

*Primary Examiner*—Brian Dutton
*Attorney, Agent, or Firm*—Fish & Richardson P.C.

[57] ABSTRACT

A method for manufacturing a semiconductor, comprising crystallizing an amorphous silicon film formed on a substrate by employing lateral growth method using a catalyst element which accelerates the crystallization, wherein the duration of annealing accounts for 90% or more but less than 100% of the time for crystallization of the amorphous silicon film under the condition that no catalyst element is used. Also provided is a method for manufacturing a semiconductor, comprising: obtaining the equation which relates the annealing temperature to the duration of annealing in case crystallization of the amorphous silicon film initiates spontaneously; obtaining the equation which relates the annealing temperature to the laterally grown distance in case lateral growth method using a catalyst element for accelerating crystallization is applied to the amorphous silicon film formed on the substrate above; specifying the annealing duration and the annealing temperature which satisfy the relationship above for a desired growth distance; and performing annealing at a temperature not higher than said annealing temperature, and thereby laterally growing the amorphous silicon film by using a catalyst element. Further, semiconductor devices are provided using the semiconductor manufactured by the methods described above.

21 Claims, 12 Drawing Sheets

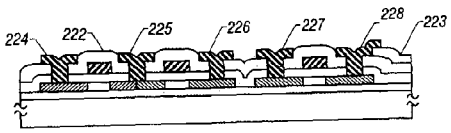

FIG. 2F